(12) United States Patent
Kim

(10) Patent No.: US 8,507,343 B2
(45) Date of Patent: Aug. 13, 2013

(54) VARIABLE RESISTANCE MEMORY DEVICE AND METHOD OF MANUFACTURING THE SAME

(75) Inventor: Jung-in Kim, Seoul (KR)

(73) Assignee: Samsung Electronics, Co., Ltd. (KR)

(*) Notice: Subject to any disclaimer, the term of this patent is extended or adjusted under 35 U.S.C. 154(b) by 69 days.

(21) Appl. No.: 13/327,017

(22) Filed: Dec. 15, 2011

(65) Prior Publication Data

US 2012/0225533 A1 Sep. 6, 2012

(30) Foreign Application Priority Data

Mar. 4, 2011 (KR) ........................ 10-2011-0019551

(51) Int. Cl.
*H01L 21/336* (2006.01)

(52) U.S. Cl.
USPC ......... 438/258; 438/3; 438/102; 257/E21.645

(58) Field of Classification Search
USPC ...................................... 438/258, 259, 3, 102
See application file for complete search history.

(56) References Cited

U.S. PATENT DOCUMENTS

| 7,906,773 B2 | 3/2011 | Ko et al. |
| 2008/0137400 A1 | 6/2008 | Chen et al. |
| 2009/0242866 A1 | 10/2009 | Ko et al. |

FOREIGN PATENT DOCUMENTS

| KR | 20090103564 | 10/2009 |
| KR | 20100097298 | 9/2010 |

*Primary Examiner* — Charles Garber
*Assistant Examiner* — Reema Patel
(74) *Attorney, Agent, or Firm* — Onello & Mello, LLP

(57) ABSTRACT

In a variable resistance memory device and a method of manufacturing the variable resistance memory device, the generation of a seam, or void, is avoided in the device that, if present, may otherwise reduce the reliability of the resulting device.

15 Claims, 25 Drawing Sheets

VARIABLE RESISTANCE MEMORY DEVICE AND METHOD OF MANUFACTURING THE SAME

CROSS-REFERENCE TO RELATED APPLICATIONS

This U.S. non-provisional patent application claims priority under 35 U.S.C. §119 of Korean Patent Application No. 10-2011-0019551, filed on Mar. 4, 2011, the entire content of which is hereby incorporated by reference.

BACKGROUND

The present inventive concept herein relates to a memory device and a method of manufacturing the same, and more particularly, to a variable resistance memory device and a method of manufacturing the same.

Semiconductor memory devices have steadily improved in speed and cost-per-bit over many generations of technology. Moore's Law, the idea that the density of integrated circuits may double approximately every two years, has generally held true in the field of semiconductor memories for nearly fifty years. However, as device sizes shrink, there is some concern that integrated circuits in general, and semiconductor memory devices in particular, may be fast-approaching fundamental limitations on device density. Semiconductor memory devices that continue to scale down to sub 20 nm geometries would therefore be highly desirable. Semiconductor memory devices that, unlike dynamic random access memories (DRAMs), retain information even when power is withdrawn (i.e., they are non-volatile), would also be highly desirable. Some candidates for next generation semiconductor memory devices include: ferroelectric random access memory (FRAM), magnetoresistive random access memory (MRAM) and phase change random access memory (PRAM). Some next generation memory devices include materials that present different resistance values, depending upon applied voltage and current profiles, for example. Once programmed to a particular memory state, the device tends to remain in that state, even when power is withdrawn from the device. That is, such a resistance-based memory device may be non-volatile. Additionally, variable resistance memory devices, such as PRAM devices, may exhibit high operation speeds and, with a potential for very small features sizes, may provide very high degrees of integration, and systems and methods to develop PRAM devices would therefore be highly desirable.

SUMMARY

Embodiments of the inventive concept provide a method of manufacturing a variable resistance memory device. The method may include forming an inter-insulating layer including a hole on a substrate; forming a selection device in a lower portion of the hole; forming a first electrode including a first part electrically connected to the selection device and contacting a side surface of upper portion of the hole and a second part extending from the first part to be parallel to a surface of the substrate; forming a first insulating pattern including a third part contacting the first part and a fourth part extending from the third part to contact the second part and having the same thickness as the third part, the first insulating pattern being disposed on the first electrode; forming a trench limited by the first insulating pattern and the inter-insulating layer by partly etching a sidewall of the inter-insulating layer facing the third part; forming a second insulating pattern filling the trench; and forming a variable resistance pattern and an upper electrode on the first electrode.

In some embodiments, forming the first electrode comprises: conformally forming a first electrode layer on the inter-insulating layer including the hole in which the selection device is formed; conformally forming a first insulating layer on the first electrode layer; forming a photoresist pattern partly covering the first insulating layer formed on a sidewall of the hole, the photoresist pattern being disposed on the first insulating layer; and etching the first electrode layer and the first insulating layer using the photoresist pattern as an etching mask to form the first insulating pattern in concurrence with the first electrode.

In some embodiments, forming the photoresist pattern comprises: forming an organic anti-reflection layer and a photoresist layer filling the hole in which the first insulating layer is formed; and forming the photoresist pattern and an organic anti-reflection pattern by performing an exposure process and a development process on the photoresist layer.

In some embodiments, the trench is formed by removing the photoresist pattern.

In some embodiments, forming the first electrode comprises: conformally forming a first electrode layer on the inter-insulating layer including the hole in which the selection device is formed; conformally forming a first insulating layer on the first electrode layer; forming an organic hard mask partly covering the first insulating layer formed on a sidewall of the hole; and etching the first electrode layer and the first insulating layer using the organic hard mask as an etching mask to form the first insulating pattern in concurrence with the first electrode.

In some embodiments, forming the organic hard mask comprises: forming an organic polymer compound filling the hole in which the first insulating layer is formed; and forming the organic hard mask by patterning the organic polymer compound.

In some embodiments, the organic polymer compound comprises silicon organic hybrid.

In some embodiments, the trench is formed by removing the organic hard mask.

In some embodiments, the first insulating pattern comprises material having an etching selectivity with respect to the inter-insulating layer.

In some embodiments, the method further comprises forming an ohmic pattern between the selection device and the first electrode.

Embodiments of the inventive concept also provide a variable resistance memory device. The variable resistance memory device may include an inter-insulating layer including a hole on a substrate; a selection device disposed at a lower portion of the hole; a first electrode electrically connected to the selection device and including a first part contacting a sidewall of upper portion of the hole and a second part extending from the first part to be parallel to a surface of the substrate; a first insulating pattern including a third part contacting the first part and a fourth part extending from the third part to contact the second part and having the same thickness as the third part, the first insulating pattern being disposed on the first electrode; a second insulating pattern filling the hole on the first insulating pattern; and a variable resistance pattern electrically connected to the first electrode and a second electrode.

In some embodiments, a width of upper portion of the hole is greater than a width of lower portion of the hole.

In some embodiments, one end of the fourth part is disposed on the second part.

In some embodiments, the first electrode further comprises a third part extending from the second part and having a top surface lower than the first part and the fourth part is disposed to be in contact with the third part.

In some embodiments, top surfaces of the first part, the third part and the second insulating pattern are pattern are substantially at a same vertical position relative to one another.

In exemplary embodiments in accordance with principles of inventive concepts a variable resistance memory is formed by forming a hole within an inter-insulating layer formed on a substrate; forming a hole within an inter-insulating layer formed on a substrate; forming a selection device in a lower portion of the hole; forming an electrode layer in the hole over the selection device; forming an insulating layer over the electrode layer in the hole; burying the hole with a relatively low-viscosity material; forming a trench in the low-viscosity material and in a portion of the electrode layer and in a portion of the insulating layer and in a portion of the inter-insulating layer, leaving at least a vertical segment of electrode layer and a vertical segment of insulating layer in the hole; removing the low-viscosity material and filling the remnant of the trench with a second insulating layer; planarizing the wafer to expose a first electrode pattern, a first insulating layer pattern, and a second insulator pattern, the tops of which are all substantially at the same height as the top of the inter-insulating layer; forming a variable resistance pattern on top of and in contact with the top of the first electrode pattern; and forming a second electrode pattern on top of the variable resistance pattern.

In some embodiments. the step of forming a hole within an inter-insulating layer further comprises forming a hole over a first memory access line.

In some embodiments. the step of forming a second electrode pattern further comprises forming a second memory access line in contact with the second electrode.

In some embodiments. the step of forming a selection device, further comprises the step of forming a diode.

In some embodiments. the step of forming a variable resistance pattern further comprises forming a pattern of phase change material.

BRIEF DESCRIPTION OF THE FIGURES

The foregoing and other features and advantages will be apparent from the more particular description of preferred aspects, as illustrated in the accompanying drawings in which like reference characters refer to the same parts throughout the different views. The drawings are not necessarily to scale, emphasis instead being placed upon illustrating the principles of the embodiments. In the drawings, the thickness of layers and regions are exaggerated for clarity.

DETAILED DESCRIPTION OF THE EMBODIMENTS

Figure 1:
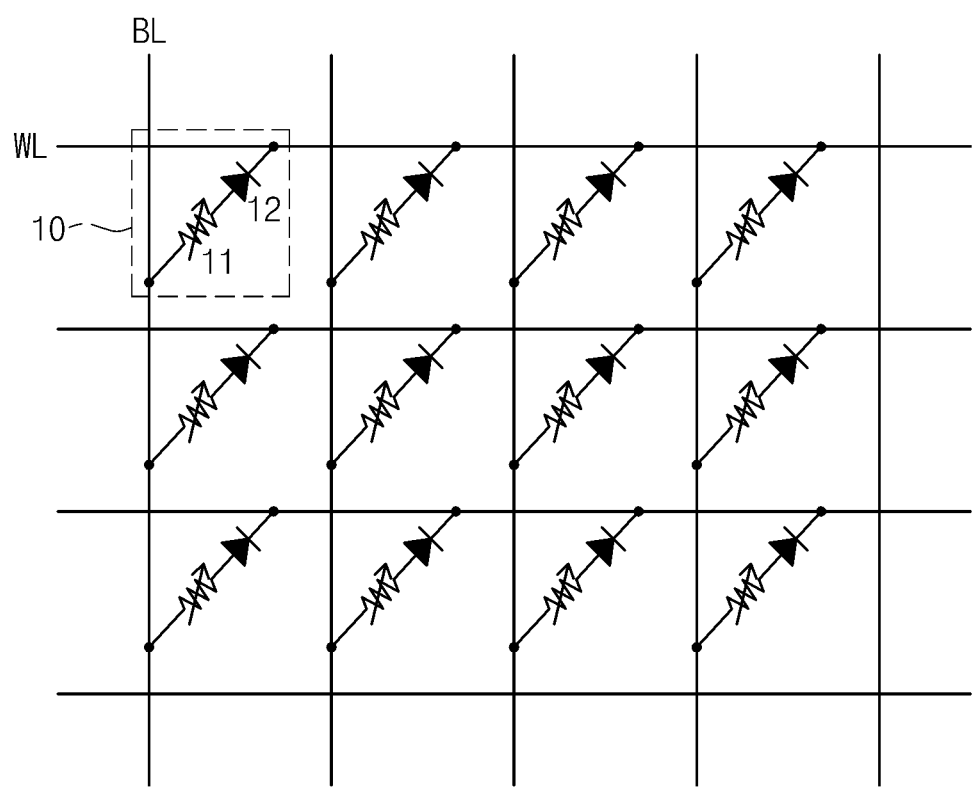
FIG. 1 is a circuit diagram illustrating a memory cell array of variable resistance memory device in accordance with the principles of inventive concepts.

Exemplary embodiments of the inventive concepts will now be described more fully with reference to the accompanying drawings, in which exemplary embodiments of the inventive concepts are shown. Exemplary embodiments of the inventive concept may, however, be embodied in many different forms and should not be construed as limited to the embodiments set forth herein; rather, these exemplary embodiments of the inventive concept are provided so that this description will be thorough and complete, and will fully convey the concept of exemplary embodiments of the inventive concept to those of ordinary skill in the art. In the drawings, the thicknesses of layers and regions are exaggerated for clarity. Like reference numerals in the drawings denote like elements, and thus their description will be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath," "below," "lower," "above," "upper," "top," "bottom," "vertical," "horizontal," "side," "left," "right," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated, for example, 90 degrees or at other orientations) and the spatially relative descriptors used herein interpreted accordingly.

The terminology used herein is for the purpose of describing particular exemplary embodiments of the inventive concept only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the inventive concepts are described herein with reference to cross-sectional illustrations that are schematic illustrations of idealized exemplary embodiments of the inventive concept (and intermediate structures). As such, variations from the shapes of the illustrations as a result, for example, of manufacturing techniques and/or tolerances, are to be expected. Thus, exemplary embodiments of the inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Although exemplary embodiments describe "relatively high" and "relatively low" resistance states, a system and method in accordance with inventive concepts may be applied to variable resistance devices that exhibit more than two states and may be employed as multi-level cells, for example.

FIG. 1 is a circuit diagram illustrating a memory cell array of variable resistance memory device in accordance with some embodiments of inventive concepts. Multiple memory cells 10 are arranged in a matrix array. Each memory cell 10 may include a variable resistance device 11 and a selection device 12. The variable resistance device 11 may be connected between a bit line BL and the selection device 12 and the selection device 12 may be connected between the variable resistance device 11 and a word line WL.

The variable resistance device 11 may include, for example, phase change material, ferroelectric material or magnetoresistive material. A state of the variable resistance device 11 may be determined by the level and time-profile of voltages and currents provided through the bit line BL.

The selection device 12 may be connected between the variable resistance device 11 and a word line WL and a current supplied to the variable resistance device 11 may be controlled depending on a voltage of the word line WL. Although a diode is illustrated in this exemplary embodiment, a MOS transistor or a bipolar transistor may be used, for example, as the selection device 12.

Hereafter, in the embodiments of the inventive concept, a variable resistance memory device including memory cells adopting phase change material is used as the variable resistance device 11 by example. However, a technical spirit of the inventive concept is not limited thereto and it may be applied to a resistance random access memory (RRAM), a FRAM, or a MRAM, as well.

In exemplary PRAM embodiments of inventive concepts, the "phase," (amorphous or crystalline) and associated resistance (respectively, relatively high or relatively low) of phase change material may be affected by the temperature, and, more particularly, the temperature profile, of phase change material in variable resistance device 11. By applying current to phase change material (through a first electrode, for example) phase change material in a device 11 may be heated by Joule-effect heating and, with sufficient heating over a sufficient period of time, may become crystalline. If current, and accompanying heat, are rapidly withdrawn, the material may be "quenched" and may remain in a crystalline, relatively high resistance state. If current, and accompanying heat, are withdrawn less rapidly, the phase change material may transition to an amorphous, relatively high-resistance state, and remain in that state after all current is withdrawn.

Figure 2A:
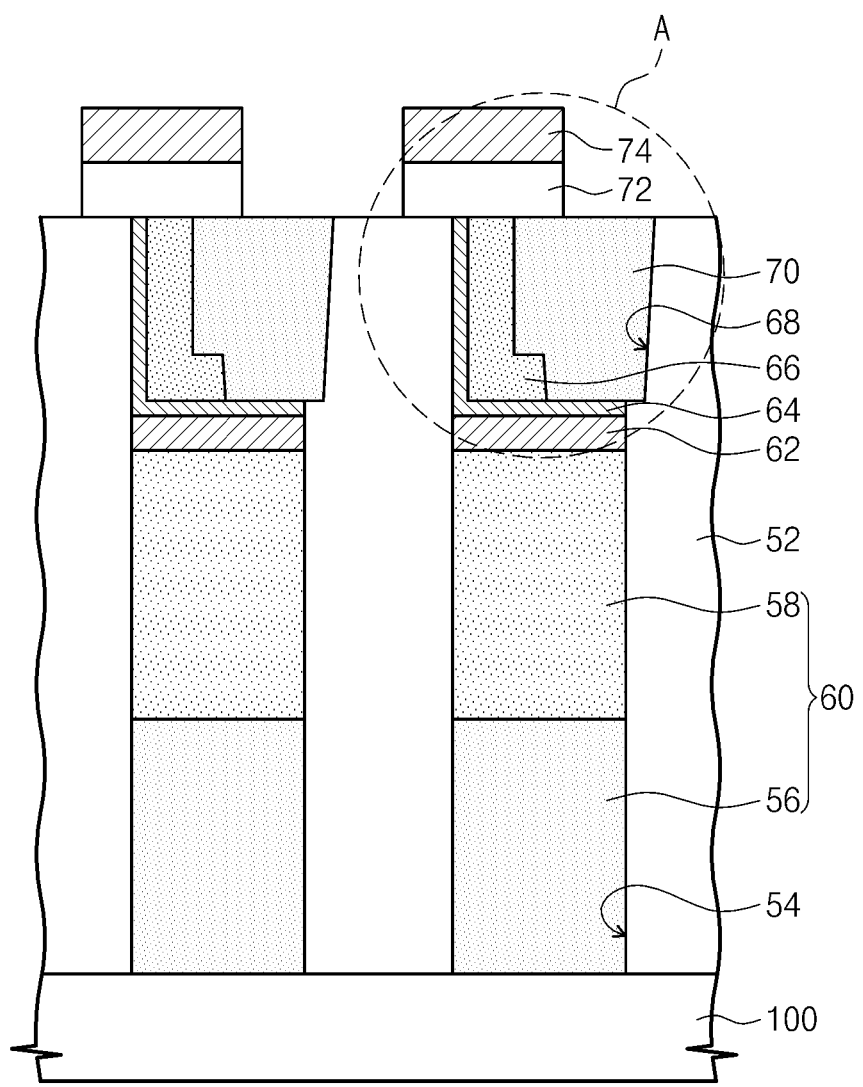
FIGS. 2A and 2B are cross sectional views for describing a variable resistance memory device in accordance with the principles of inventive concepts.
Figure 2B:
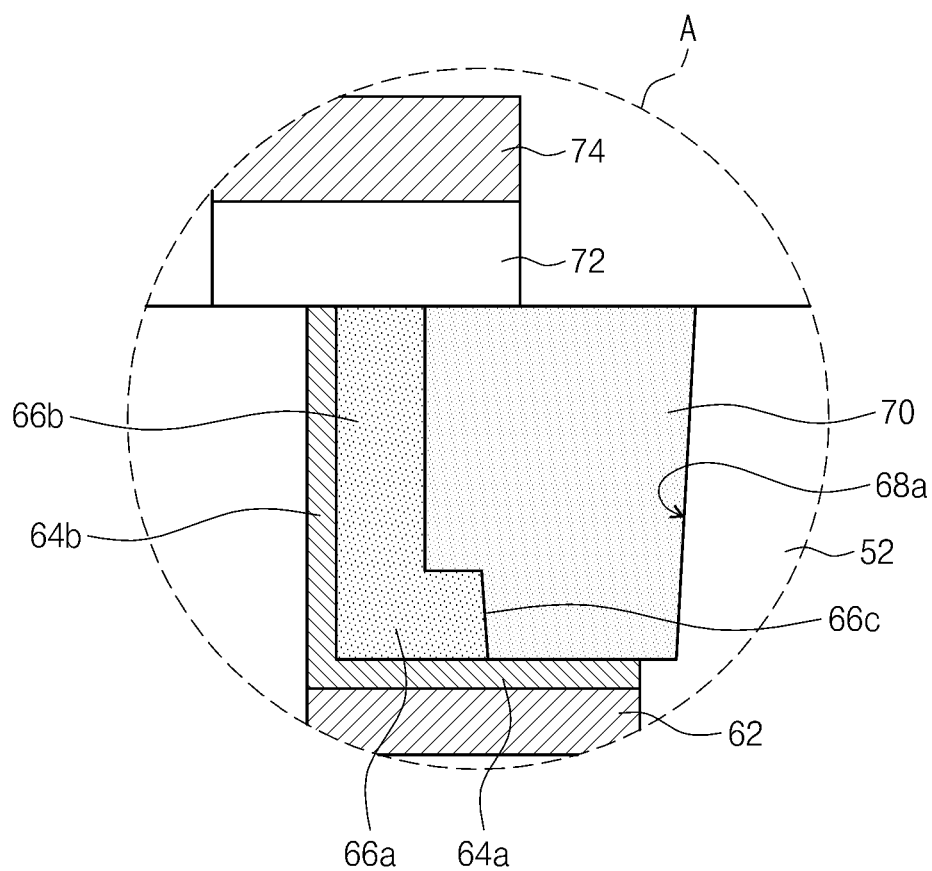

FIGS. 2A and 2B are cross sectional views of an exemplary embodiment of a variable resistance memory device in accordance with principles of inventive concepts. FIG. 2B is a cross sectional view enlarging the 'A' part of FIG. 2A.

Referring to FIGS. 2A and 2B, a variable resistance memory device may include a word line (not illustrated), a selection device 60, an ohmic pattern 62, a first electrode 64, a first insulating pattern 66, a second insulating pattern 70, a variable resistance pattern 72 and a second electrode 74.

A word line may be disposed on a substrate 100 in a line shape extending in a first direction. For example, the word line may be formed of silicon doped with an impurity, a metal or a metal compound. According to one aspect of the inventive concept, word lines may be plural in number and disposed in parallel, spaced apart from one another.

An inter-insulating layer 52 may be disposed on the substrate 100 where the word lines are disposed. The inter-insulating layer 52 may include an oxide, a nitride or an oxynitride. The inter-insulating layer 52 may include a silicon oxide, a silicon nitride or a silicon oxynitride. According to one aspect of inventive concepts, the inter-insulating layer 52 may include one or more holes 54 that may expose a part of a top surface of a word line.

A selection device 60 may be electrically connected to a word line. According to one aspect of an exemplary embodiment in accordance with inventive concepts, selection device 60 may be disposed in a lower portion of hole 54 while contacting a top surface of a word line. A plurality of selection devices 60 may be disposed on a word line, spaced apart from one another. According to one aspect of an exemplary embodiment in accordance with the principles of inventive concepts, selection device 60 may be a diode, having a first semiconductor pattern 56 doped with an impurity of first a conductivity type and a second semiconductor pattern 58 doped with an impurity of second conductivity type, opposed to the first conductivity type stacked on top of the first pattern within the lower portion of hole 54.

Ohmic pattern 62 may be disposed in hole 54 and contact a top surface of selection device 60. Ohmic pattern 62 may include metal semiconductor material. For example, ohmic pattern 62 may include titanium silicide (TiSi), cobalt silicide (CoSi) or nickel silicide (NiSi). According to one aspect of an exemplary embodiment in accordance with the principles of inventive concepts, the horizontal cross section of ohmic pattern 62 may have the same shape and area as selection device 60, so that a bottom surface of ohmic pattern 62 may substantially conform to a top surface of selection device 60, and both substantially fill, from side to side, hole 54.

In an exemplary embodiment in accordance with the principles of inventive concepts, first electrode 64 may be disposed on the ohmic pattern 62 in the hole 54. According to exemplary embodiments of inventive concepts, when viewing a cross section of first electrode 64 by vertically cutting first electrode 64, first electrode 64 may have an "L" character shape. First electrode 64 may have a first, horizontal, part 64a contacting the ohmic pattern 62 and a second, vertical, part 64b extending upwardly from one side, or edge, of the first part 64a. According to one aspect of an exemplary embodiment in accordance with the principles of inventive concepts, first electrode horizontal part 64a may have the same shape and area as ohmic pattern 62, so that a bottom surface of first electrode horizontal part 64a may substantially conform to a top surface of ohmic pattern 62, and both substantially fill, from side to side, hole 54. First electrode vertical part 64b may contact and extend along inter-insulating layer 52 until it reaches, and remains even with, a top surface of inter-insulating layer 52. First electrode 64 may be of substantially uniform thickness, with the thickness of first electrode horizontal part 64a (also referred to herein as first part 64a) equal to the thickness of first electrode vertical part 64b (also referred to herein as second part 64b), for example.

According to one aspect of an exemplary embodiment in accordance with the principles of inventive concepts, first electrode 64 may not completely fill hole 54 of the inter-insulating layer 52. That is, although first electrode horizontal part 64a may substantially extend, side to side, across hole 54, first electrode vertical part 64b may only extend only a part of the way, only the thickness of the first electrode, from a wall of inter-insulating layer 52 with which it is in contact, toward the center of hole 54.

In an exemplary embodiment in accordance with principles of inventive concepts, a trench 68 formed in inter-insulating layer 52 may intersect a hole 54 and thereby expose at least a portion of first electrode 64 and inter-insulating layer 52. In particular, trench 68 may expose at least a portion of a surface, such as a top surface, of first electrode horizontal section 64a and a section of inter-insulating layer 52, which may form a portion of the trench bottom. A trench sidewall 68a may be positive-sloped and formed of exposed inter-insulating layer 52, for example.

A first insulating pattern 66 may be disposed on the first electrode 64. First insulating pattern 66 may include a material having an etching selectivity with respect to the inter-insulating layer 52. According to one aspect of an exemplary embodiment in accordance with principles of inventive concepts, if inter-insulating layer 52 includes an oxide, first insulating pattern 66 may include a nitride, such as silicon nitride.

According to an exemplary embodiment in accordance with the principles of inventive concepts, when viewing a cross section of the first insulating pattern 66 by vertically cutting the first insulating pattern 66, the first insulating pattern 66 may have an "L" character shape. As an illustration, the first insulating pattern 66 may include a first insulating pattern horizontal part 66a (also referred to herein as "third part") contacting a horizontal part 64a of first electrode 64 and a first insulating pattern vertical part 66b (also referred to herein as "fourth part") upwardly extending from one end of the horizontal first insulating pattern part 66a, in contact with, and upwardly extending along, first vertical electrode part 64b. The first insulating pattern horizontal part 66a may be disposed to partly cover the first electrode horizontal part 64a.

In an exemplary embodiment in accordance with principles of inventive concepts, a bottom side of horizontal first insulating pattern 66a may be located on and make contact with first electrode horizontal part 64a. A negative-sloping vertical side 66c of first insulating pattern horizontal part 66a (a side not contacting first electrode vertical part 64b) may face a sidewall 68a of trench 68. A side of first insulating pattern vertical part 66b not in contact with first electrode vertical part 64b may be vertical and face sidewall 68a of trench 68. A top surface of first insulating pattern vertical part 66b may be even with a top surface of first electrode vertical part 64b. The thickness of the first insulating pattern vertical part 66b may be equal to the thickness of the first insulating pattern horizontal part 66a.

According to another embodiment of the inventive concept, the first insulating pattern 66 may include only the first insulating pattern horizontal part 66a without the first insulating pattern vertical part 66b. That is, when viewing a cross section of the first insulating pattern 66 by vertically cutting the first insulating pattern 66, the first insulating pattern 66 may have an "L" character shape (first exemplary embodiment) or an "I" character shape (second exemplary embodiment).

A second insulating pattern 70 may be disposed on first insulating pattern 66 while filling trench 68. In exemplary embodiments, second insulating pattern 70 may have the same material as the first insulating pattern 66. For example, second insulating pattern 70 may include nitride such as silicon nitride. In another exemplary embodiment, second insulating pattern 70 may include material different from material of first insulating pattern 66.

According to one aspect of the inventive concept, a top surface of the second insulating pattern 70 may be even with a top surface of the first electrode vertical part 64b of the first electrode 64 and a top surface of the first insulating vertical part 66b of the first insulating pattern 66.

A variable resistance pattern 72 may be disposed to be electrically connected to the first electrode 64. Also, the second electrode 74 may be disposed to be electrically connected to the variable resistance pattern 72. According to an exemplary embodiment in accordance with principles of inventive concepts, variable resistance pattern 72 and the second electrode 74 may be sequentially stacked on the first electrode 64 (more particularly, over at least a portion of the top surfaces of: vertical part 64b of first electrode 64, vertical part 66b of first insulating pattern 66, and second insulating layer 70).

Although not illustrated in detail, a bit line electrically connected to the second electrode 74 and extending in a direction (also referred to herein as a "second direction) perpendicular to the direction of word lines (also referred to herein as "first direction") may further be disposed.

Figure 3A:
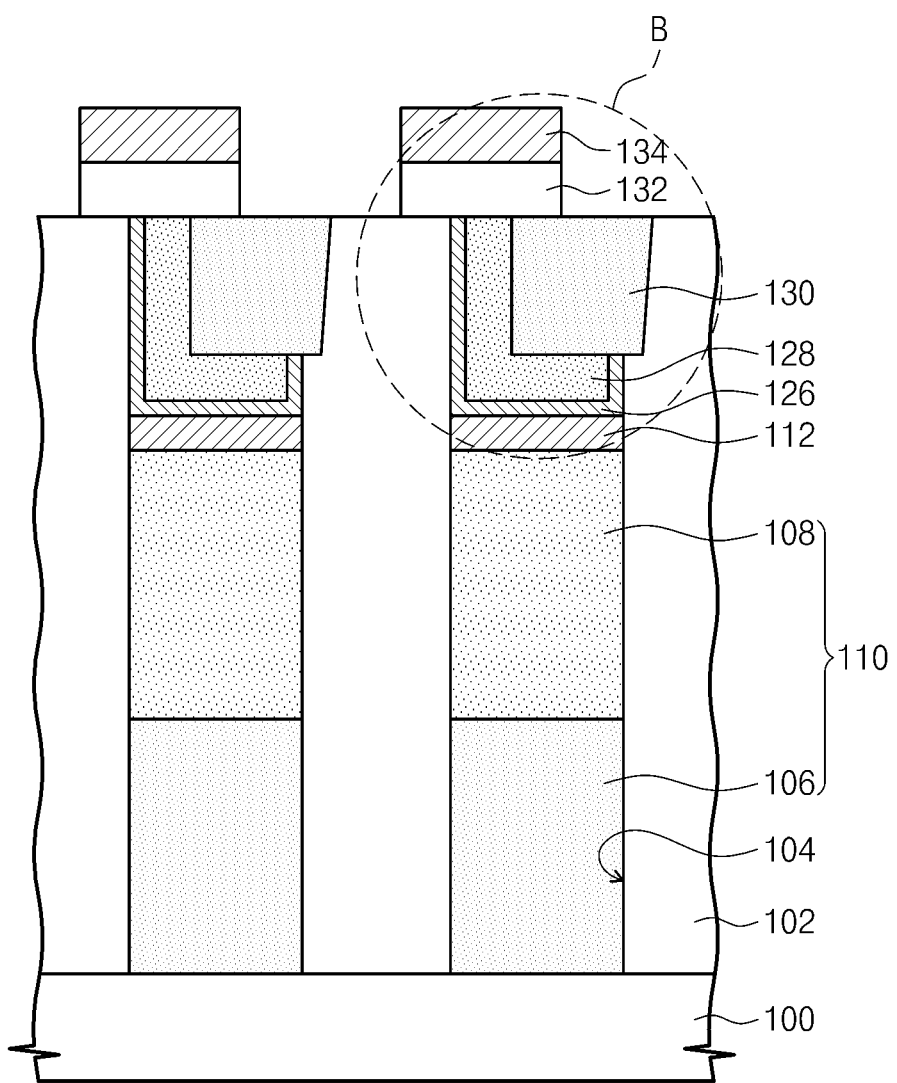
FIGS. 3A and 3B are cross sectional views for describing a variable resistance memory device in accordance with principles of inventive concepts.
Figure 3B:
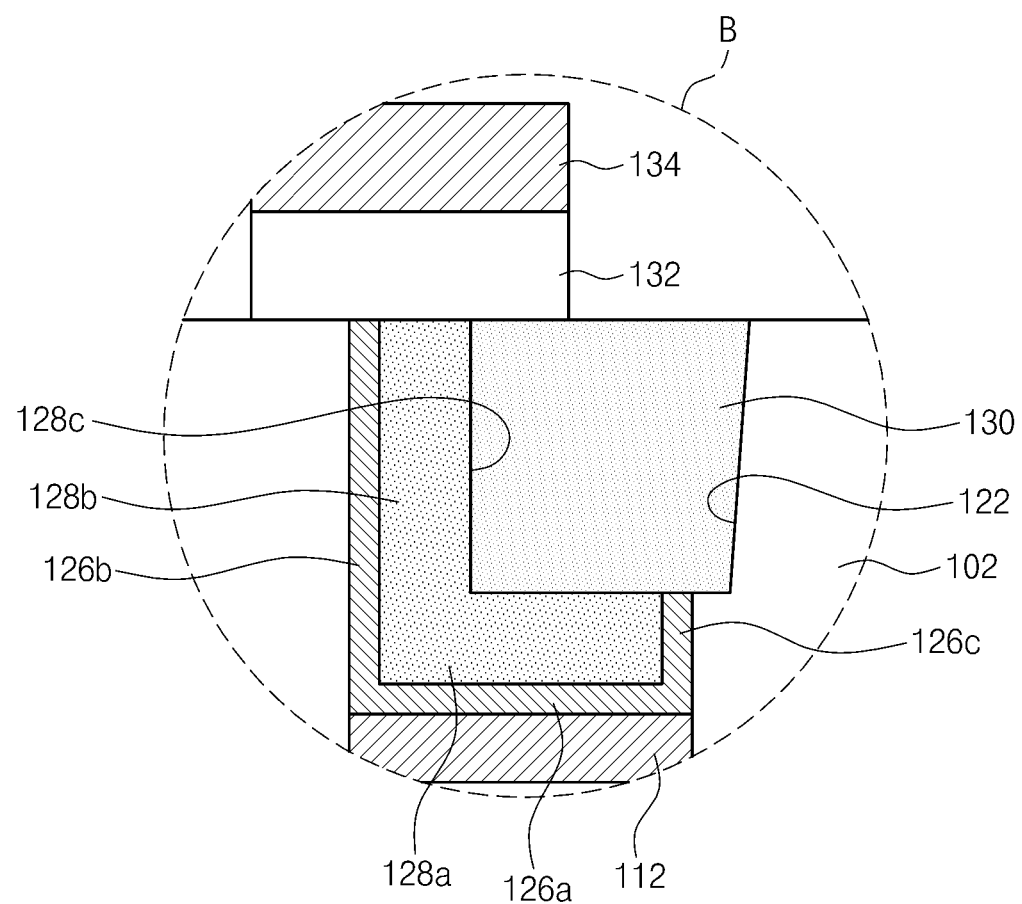

FIGS. 3A and 3B are cross sectional views of an exemplary embodiment of a variable resistance memory device in accordance with principles of inventive concepts. FIG. 3B is a cross section enlarging the "B" part of FIG. 3A.

Referring to FIGS. 3A and 3B, a variable resistance memory device may include a word line, a selection device 110, an ohmic pattern 112, a first electrode 126, a first insulating pattern 128, a second insulating pattern 130, a variable resistance pattern 132 and a second electrode 134.

A first electrode 126 may be disposed on ohmic pattern 112 in a hole 104 of an inter-insulating layer 102 in which the selection device 110 and the ohmic pattern 112 are disposed.

In exemplary embodiments in accordance with principles of inventive concepts, when viewing a cross section of the first electrode 126 by vertically cutting first electrode 126, first electrode 126 may have a "U" character shape. More specifically, first electrode 126 may include a first electrode horizontal part 126a (also referred to herein as "first part") contacting ohmic pattern 112, a first electrode vertical part 126b (also referred to herein as "second part") extending upwardly from one end of the first electrode horizontal part 126a along and in contact with a sidewall of inter-insulating layer 102, and a first electrode second vertical part 126c (also referee to herein as third part 126c) upwardly extending from the other end of the first electrode horizontal part 126a to contact the other sidewall of inter-insulating layer 102. According to an exemplary embodiment in accordance with principles of inventive concepts, first electrode 126 may not completely fill the hole 104 of the inter-insulating layer 102. That is, although first electrode 126 horizontal part 126a may substantially extend, side to side, across hole 104, first electrode vertical part 126b and first electrode second vertical part 126c may only extend a part of the way, only the thickness of first electrode layer, from walls of inter-insulating layer 102 toward the center of hole 104.

In an exemplary embodiment in accordance with principles of inventive concepts, a trench 122 formed in inter-insulating layer 102 may intersect a hole 104 and thereby expose at least a portion of first electrode 126 and inter-insulating layer 102. In particular, trench 68 may expose at least a portion of a surface, such as a top surface, of first electrode second vertical part 126c and a section of inter-insulating layer 102, which may form a portion of the trench bottom. A trench sidewall 122 may be positive-sloped and formed of exposed inter-insulating layer 102, for example.

A first insulating pattern 128 may be disposed on first electrode 126. In exemplary embodiments in accordance with principles of inventive concepts, when viewing a cross section of the first insulating pattern 128 by vertically cutting the first insulating pattern 128, the first insulating pattern 128 may have a "L" character shape. More specifically, first insulating pattern 128 may include a horizontal part 128a (also referred to herein as a fourth part), the bottom side of first insulating pattern horizontal part 128a contacting the first electrode horizontal part 126a and the first electrode second vertical part 126c of the first electrode 126. Insulating pattern 128 may also include first insulating pattern vertical part 128b (also referred to herein as fifth part 128b) extending upwardly from first insulating horizontal part 128a. One side of the first insulating pattern vertical part 128b may contact the first electrode vertical part 126b of the first electrode 126. The other side of the first insulating pattern vertical part 128b may form one sidewall of trench 122 and may have a vertical side. A top surface of the first insulating pattern vertical part 128b may be even with a top surface of the first electrode vertical part 126b.

A second insulating pattern 130 may be disposed on the first insulating pattern 128 while filling trench 122. According to one aspect of the inventive concept, a top surface of the second insulating pattern 130 may be even with a top surface of the first electrode vertical part 126b of the first electrode 126 and a top surface of the first insulating pattern vertical part 128b of the first insulating patter 128.

A word line, selection device 110, ohmic pattern 112, first electrode 126, variable resistance pattern 132 and second electrode 134, although not described in detail, may be identical to word line, selection device 60, ohmic pattern 62, first electrode 64, variable resistance pattern 72 and second electrode 74 described in discussions related to FIGS. 1, 2A and 2B, and the descriptions thereof are omitted. Descriptions in discussions related to FIGS. 3A and 3B, except structural features of the first insulating pattern 128 and the second insulating pattern 130, may be identical to descriptions in discussions related to FIGS. 2A and 2B, and those descriptions are therefore omitted to avoid redundancy.

FIGS. 4 through 14 are cross sectional and top plan views for describing an exemplary method of manufacturing a variable resistance memory device in accordance with principles of inventive concepts. FIG. 6B is a top plan view of upper portion of FIG. 6A and FIG. 9B is a top plan view of upper portion of FIG. 9A.

Figure 4:
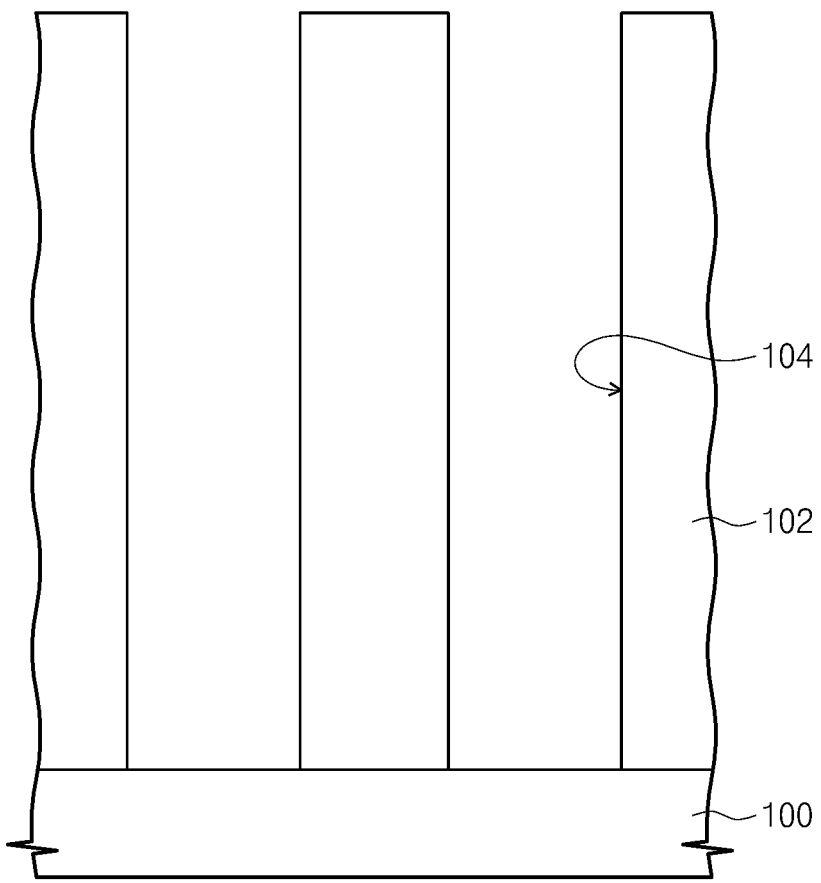
FIGS. 4 through 14 are cross sectional views and top plan views for describing a method of manufacturing variable resistance memory devices in accordance with principles of inventive concepts.

Referring to FIG. 4, an inter-insulating layer 102 including a hole 104 may be formed on a substrate 100 where word lines (not illustrated) are formed, so that a word lines is exposed to the bottom of hole 104.

Substrate 100 may be a semiconductor substrate including silicon or germanium, for example. A word line may be formed by implanting an impurity into substrate 100, for example. The word line may have a line shape extending in a first direction. In accordance with the principles of inventive concepts a plurality parallel, spaced-apart, word lines may be formed.

Inter-insulating layer 102 may be formed on substrate 100 in which the word lines are formed and may include oxide, nitride or oxynitride.

In an exemplary method in accordance with principles of inventive concepts, inter-insulating layer 102 may be etched to form hole 104, partly exposing a top surface of a word line. According to one aspect of the inventive concept, multiple holes 104 may be formed in inter-insulating layer 102 by an etching process.

Figure 5:
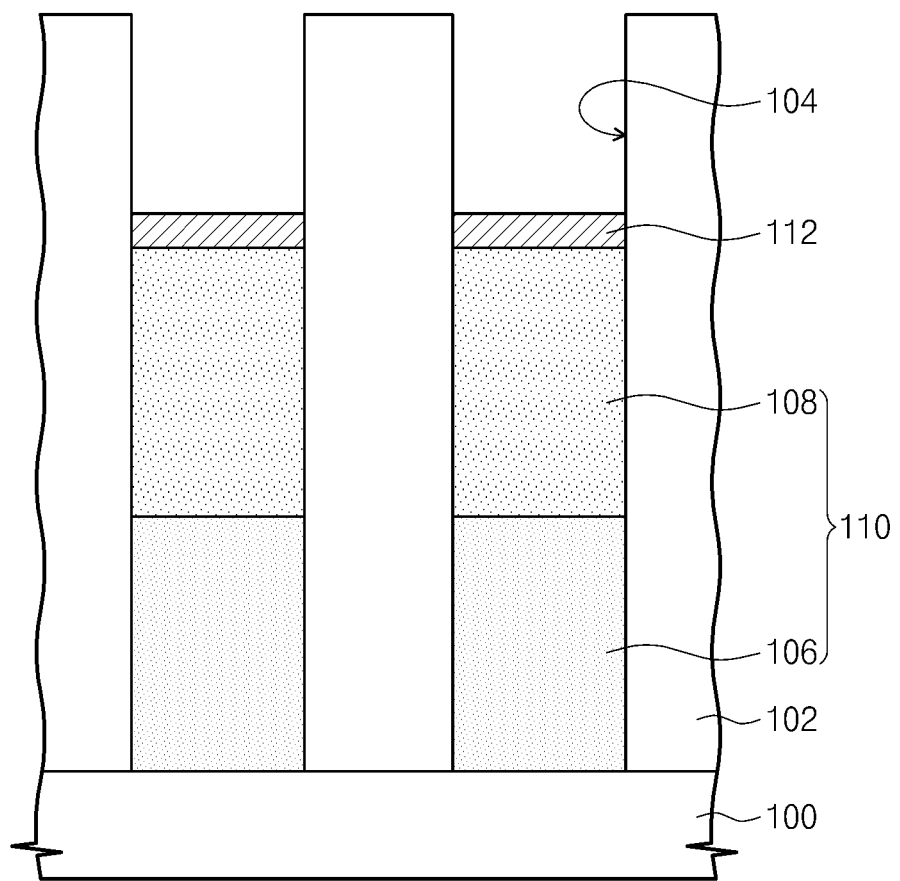

Referring to FIG. 5, a selection device 110 and an ohmic pattern 112 may be formed in a lower portion of hole 104.

A first semiconductor pattern 106 doped with a first impurity of first conductivity type and a second semiconductor pattern 108 doped with a second impurity of second conductivity type different from the first conductivity type may be sequentially formed on a top surface of the exposed word line to form, for example, a semiconductor diode. In an exemplary embodiment in accordance with inventive concepts, first and second semiconductor patterns 106 and 108 may be formed by a selective epitaxial growth process, for example.

The ohmic pattern 112 may be formed on the selection device 110. More specifically, a metal layer (not illustrated) may be conformally formed on the inter-insulating layer 102 in which the selection device 110 is formed. The metal layer may be continuously formed along a surface profile of the inter-insulating layer 102 having the hole 104 in which the selection device 110 is formed. The metal layer may be formed in a thickness insufficient to fill an upper portion of hole 104. The metal layer may include titanium (Ti), tantalum (Ta) or cobalt (Co), for example. An upper portion of the second semiconductor pattern 108 may be changed to ohmic pattern 112 by performing a thermal treatment of the metal layer. The ohmic pattern 112 may include metal semiconductor material. For instance, the ohmic pattern 112 may include titanium silicide, tantalum silicide or cobalt silicide. After forming ohmic pattern 112, material in the metal layer that does not react to the thermal treatment to form ohmic layer 112 may be removed.

Selection device 110 and the ohmic pattern 112 may be formed in a lower portion of the hole 104 and an upper portion of the hole 104 may be open. A sidewall of the inter-insulating layer 102 may be exposed in the upper portion of hole 104.

Figure 6A:
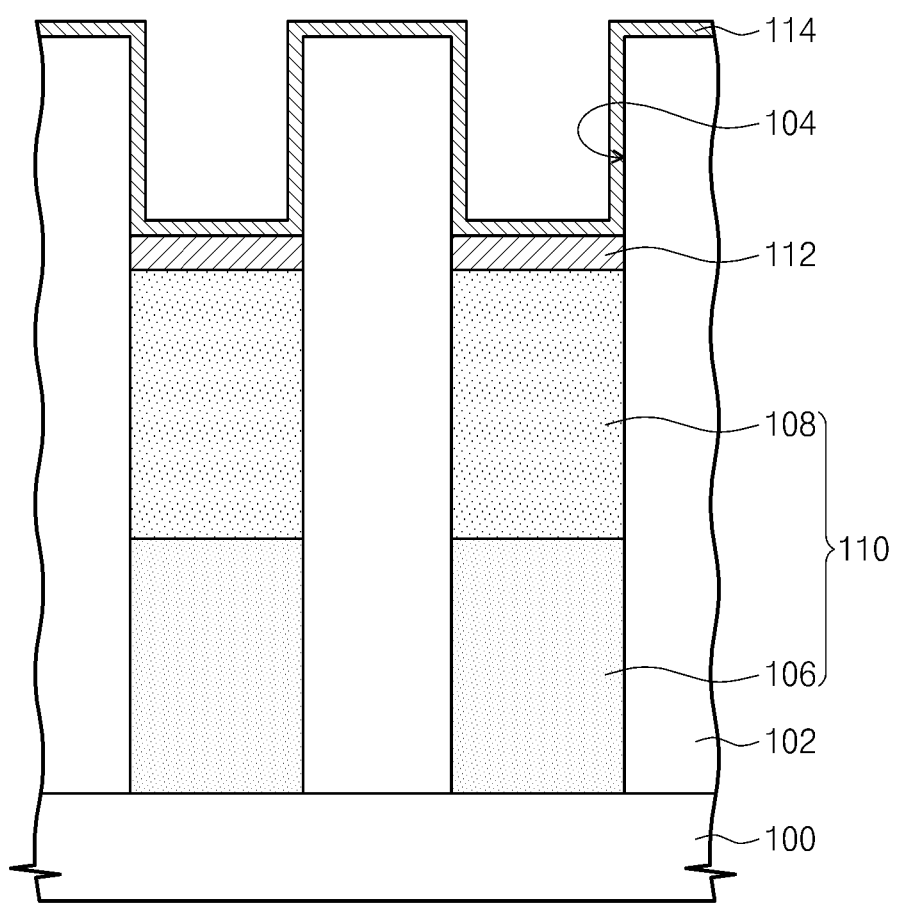
Figure 6B:
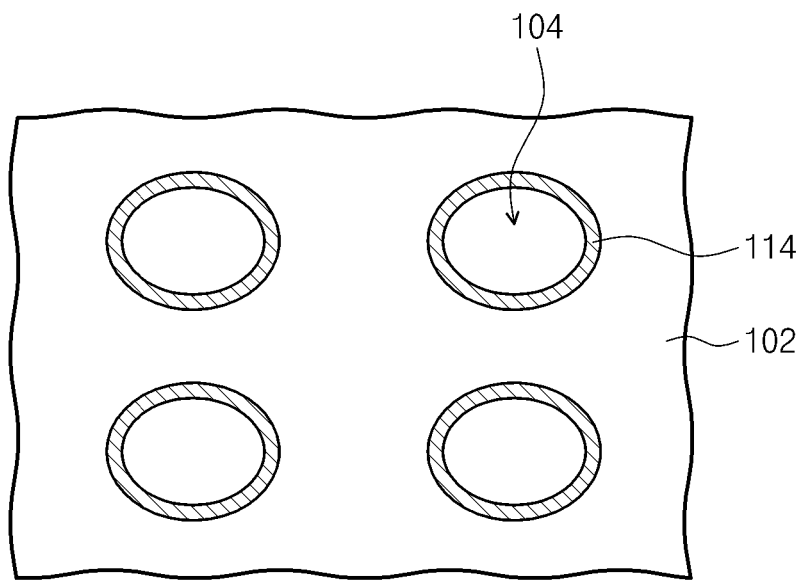

Referring to FIGS. 6A and 6B, a first electrode layer 114 may be conformally formed on the inter-insulating layer 102 in which the ohmic patter 112 is formed.

In an exemplary embodiment in accordance with the principles of inventive concepts, first electrode layer 114 may be continuously formed along a surface profile of the inter-insulating layer 102 having hole 104 in which ohmic pattern 112 is formed. First electrode layer 114 may be formed with insufficient material to fill hole 104, leaving an open volume to receive material in subsequent steps. First electrode layer 114 may include metal compound. In an exemplary embodiment in accordance with the principles of inventive concepts, the first electrode layer 114 may include titanium nitride (TiN), titanium aluminum nitride (TiAlN), tantalum nitride (TaN), tungsten nitride (WN), molybdenum nitride (MoN), niobium nitride (NbN), titanium silicon nitride (TiSiN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), tantalum silicon nitride (TaSiN), tantalum aluminum nitride (TaAlN), titanium tungsten (TiW), titanium aluminum (TiAl), titanium oxide nitride (TiON), titanium aluminum oxide nitride (TiAlON), tungsten oxide nitride (WON), tantalum oxide nitride (TaON) or combinations thereof, for example.

The top plan view of FIG. 6B illustrates the relationship between inter-insulating layer 102, first electrode layer 114, and hole 104. In this exemplary embodiment, one can see that first electrode layer does not fill hole 104 and, in fact, forms a cup-shaped (that is, truncated cylinder) electrode layer within hole 104, with the top of the electrode layer substantially even with the top of insulating layer 102.

Figure 7:
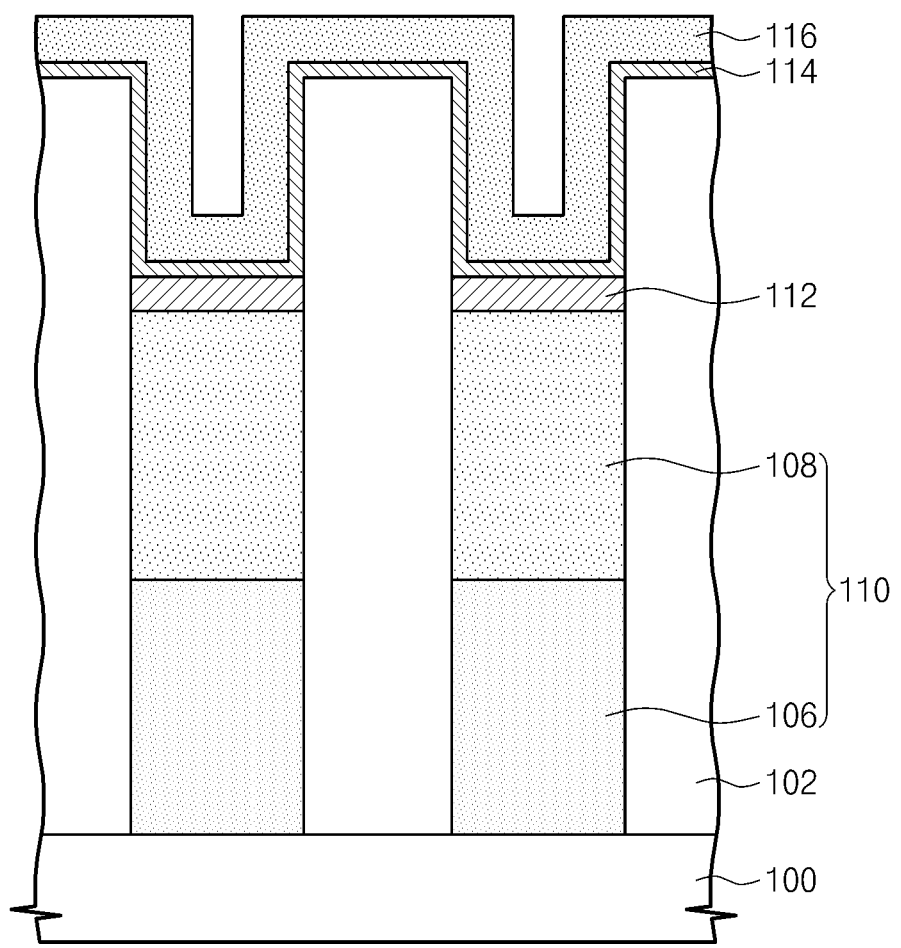

Referring to FIG. 7, a first insulating layer 116 having a specific thickness may be conformally formed over first electrode layer 114, on the inter-insulating layer 102 on which the first electrode layer 114 is formed.

First insulating layer 116 may be continuously formed along a profile of inter-insulating layer 102 having the hole 104 where the first electrode layer 114 is formed. First insulating layer 116 may be of a uniform thickness that is insufficient to fill the hole 104.

First insulating layer 116 may include material having an etching selectivity with respect to the inter-insulating layer 102. For example, in an exemplary embodiment in accordance with inventive concepts where inter-insulating layer 102 includes an oxide, first insulating layer 116 may include a nitride.

Figure 8:
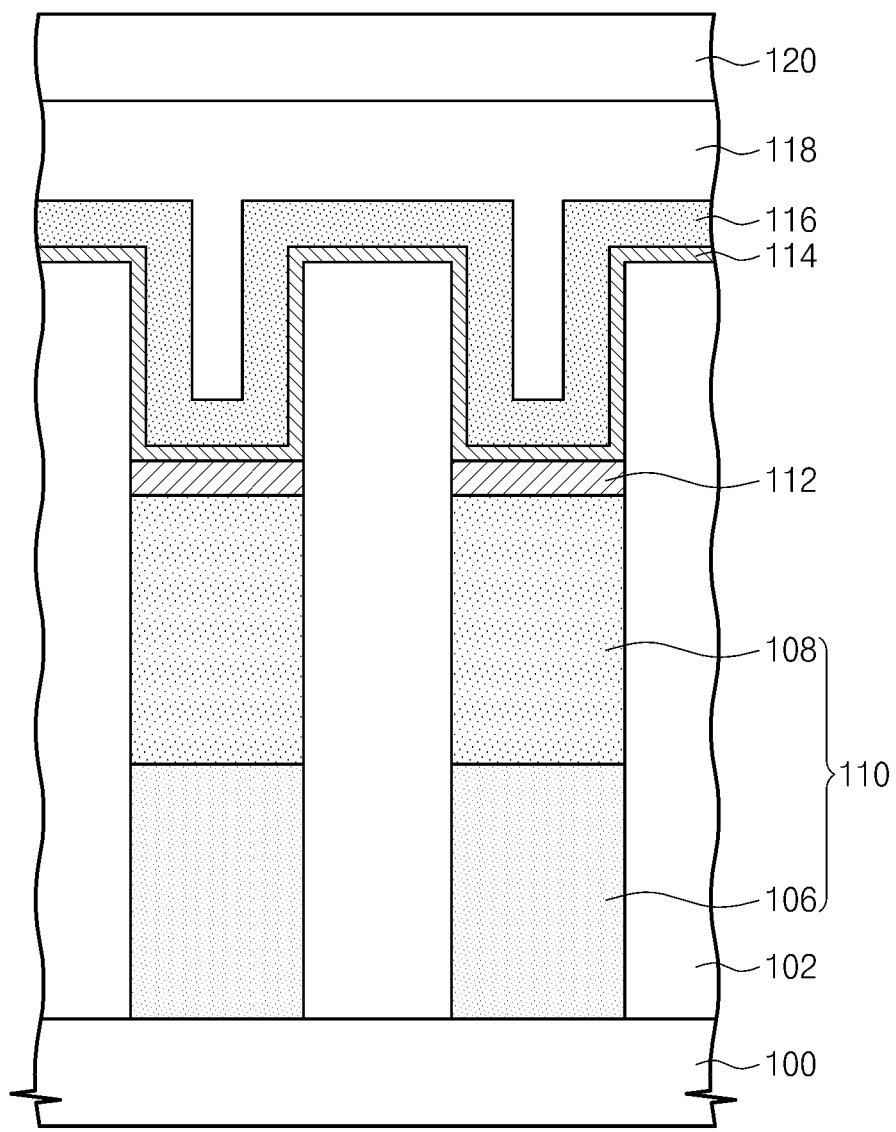

Referring to FIG. 8, in an exemplary embodiment in accordance with the principles of inventive concepts, an organic anti-reflection layer 118 and photoresist layer 120 may be sequentially formed on first insulating layer 116. In this exemplary embodiment anti-reflection layer 118 completes the filling (also referred to as "burying") of hole 104. Organic anti-reflection layer 118 may prevent reflection of a light when performing an exposure process and a development process on the photoresist layer 120. In an exemplary embodiment in accordance with principles of inventive concepts, organic anti-reflection layer 118 and photoresist layer 120 are relatively low viscosity (that is, high fluidity) materials and, as a result, they, and anti-reflection layer 118 in particular, fill hole 104 without a seam or a void. This is in contrast with higher viscosity materials, such as silicon nitride, for example, which may form a seam or void in the process of filling hole 104 and thereby, eventually, expose lower electrode 114 and reduce the reliability of a PRAM device.

Figure 9A:
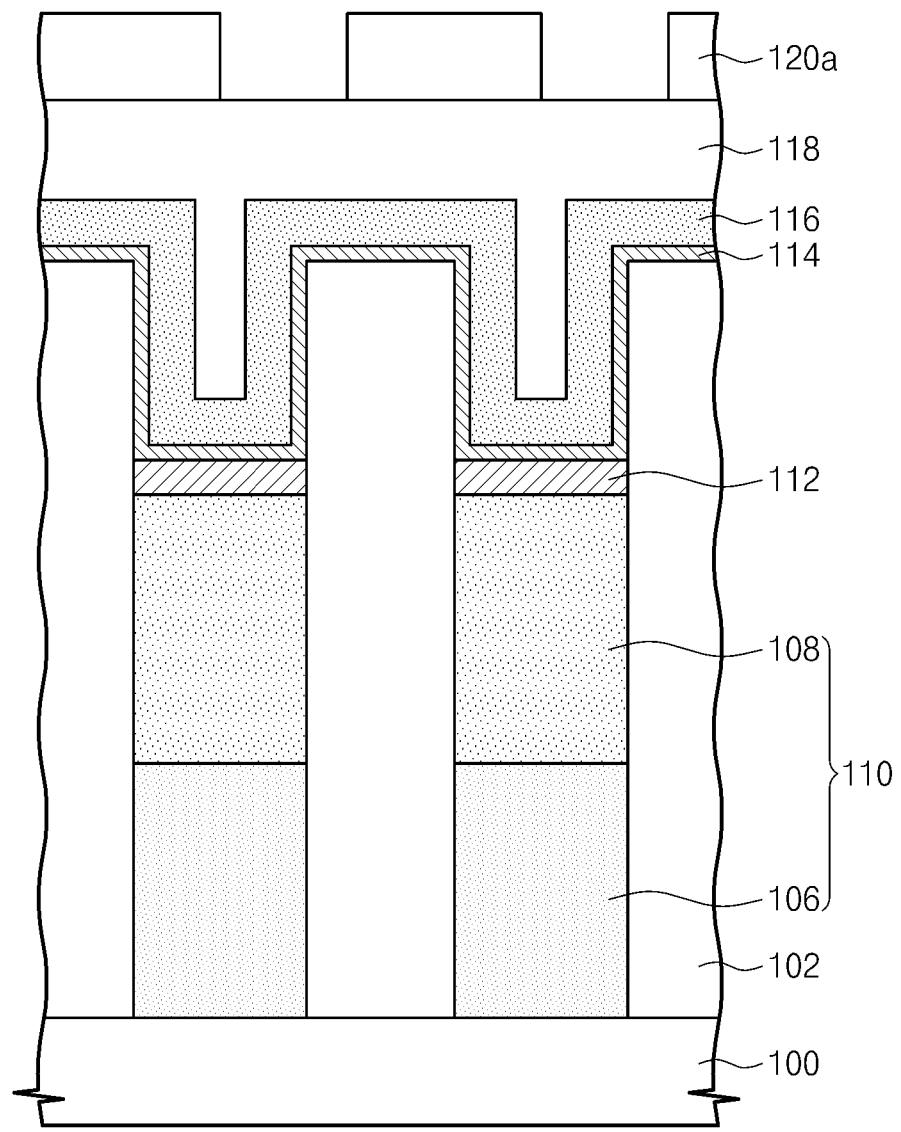
Figure 9B:
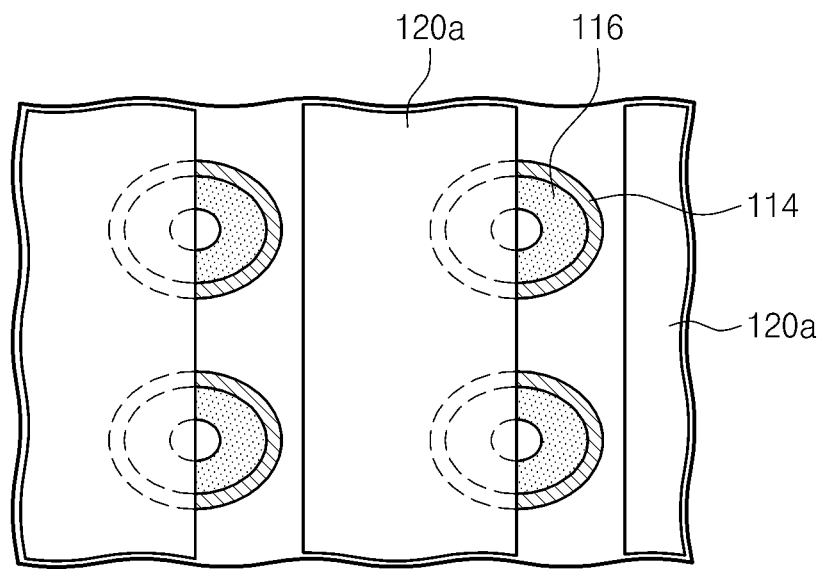

Referring to FIGS. 9A and 9B, a photoresist pattern 120a may be formed by performing an exposure process and a development process on photoresist layer 120. In an exemplary embodiment in accordance with inventive concepts, photoresist pattern 120a may expose at least a part of a sidewall of hole 104.

Figure 10:
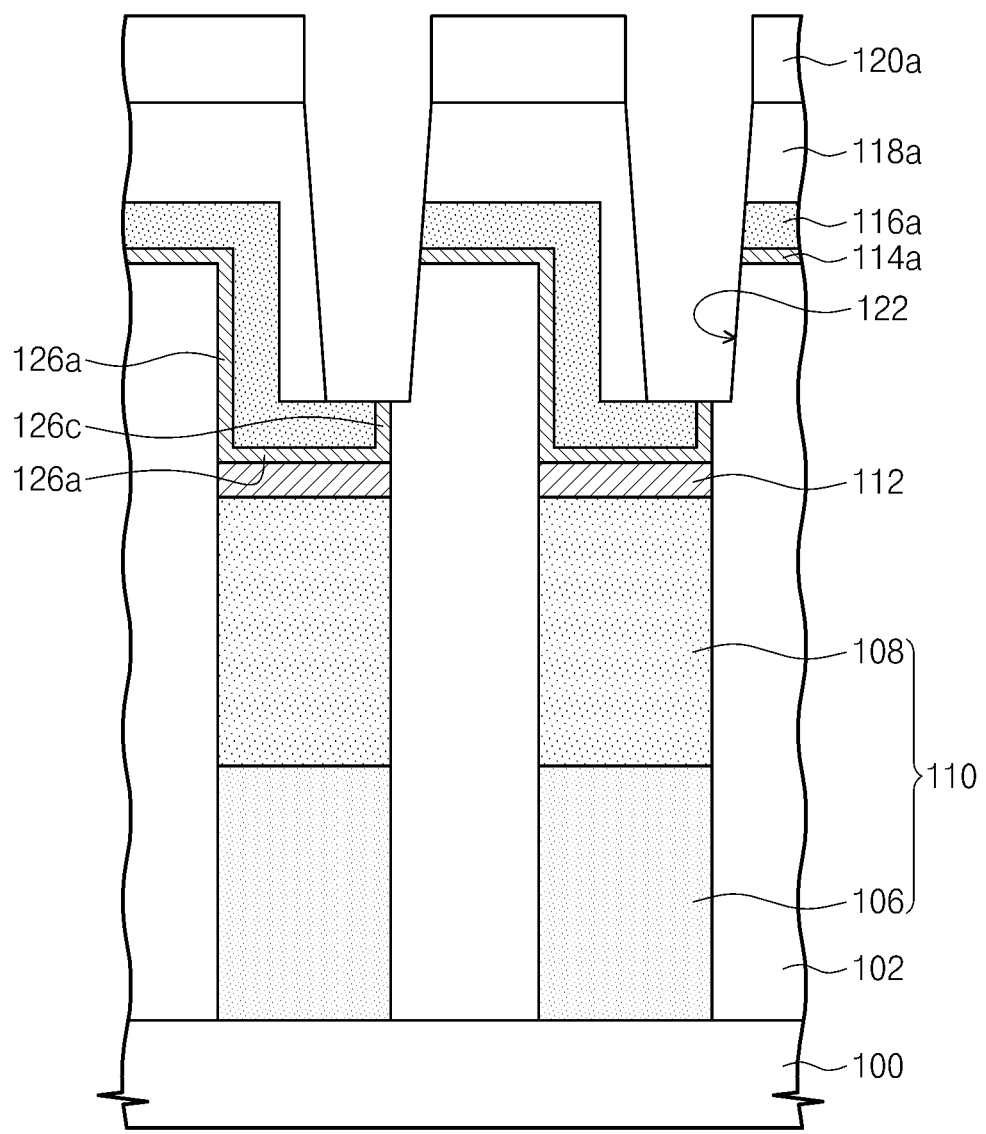

Referring to FIG. 10, in an exemplary embodiment in accordance with principles of inventive concepts, organic anti-reflection layer 118, first insulating layer 116 and first electrode layer 114 may be etched using photoresist pattern 120a as an etching mask to form organic anti-reflection pattern 118a, preliminary insulating pattern 116a and preliminary first electrode 114a.

A bottom portion of first insulating layer 116 formed in hole 104 may not be etched and, as a result, preliminary first insulating pattern 116a remaining in hole 104 may have an "L" character shape, as described in the discussion related to FIGS. 3A and 3B, for example. In this exemplary embodiment, the etching process forms a trench 122 that intersects with hole 104 and extends downward to the top of first insulating pattern horizontal part 128a, leaving first electrode horizontal part 126a and first electrode vertical part 126b substantially intact and in contact, respectively, with the top of ohmic layer 112 and with a sidewall of hole 104. The etching process removes first electrode second vertical part 126c to a point where the top of first electrode second vertical part 126c is substantially level with the top of first insulating pattern horizontal part 128a. The intact portion of first electrode second vertical part 126c remains in contact with a sidewall of hole 104 and a trench 122 exposes a portion of inter-insulating layer 102 that is substantially flush with the top of electrode second vertical part 126c and the top of first insulating pattern horizontal part 128a. In this exemplary embodiment first electrode vertical part 128b may be longer than first electrode second vertical part 128c. Due to the nature of the etching process, trench 122 may narrow as it descends toward the top of first insulating pattern horizontal part 128a and may, as a result, have a sloping sidewall.

According to another exemplary embodiment in accordance with the principles of inventive concepts, a bottom portion of the first insulating layer 116 formed in the hole 104 may be partly etched to expose a bottom portion of the first electrode layer 114, yielding a first electrode pattern having an "L" character shape. In such an exemplary embodiment, the preliminary insulating pattern 116a remaining in hole 104 may have an "L" character shape or an "I" character shape.

Figure 11:
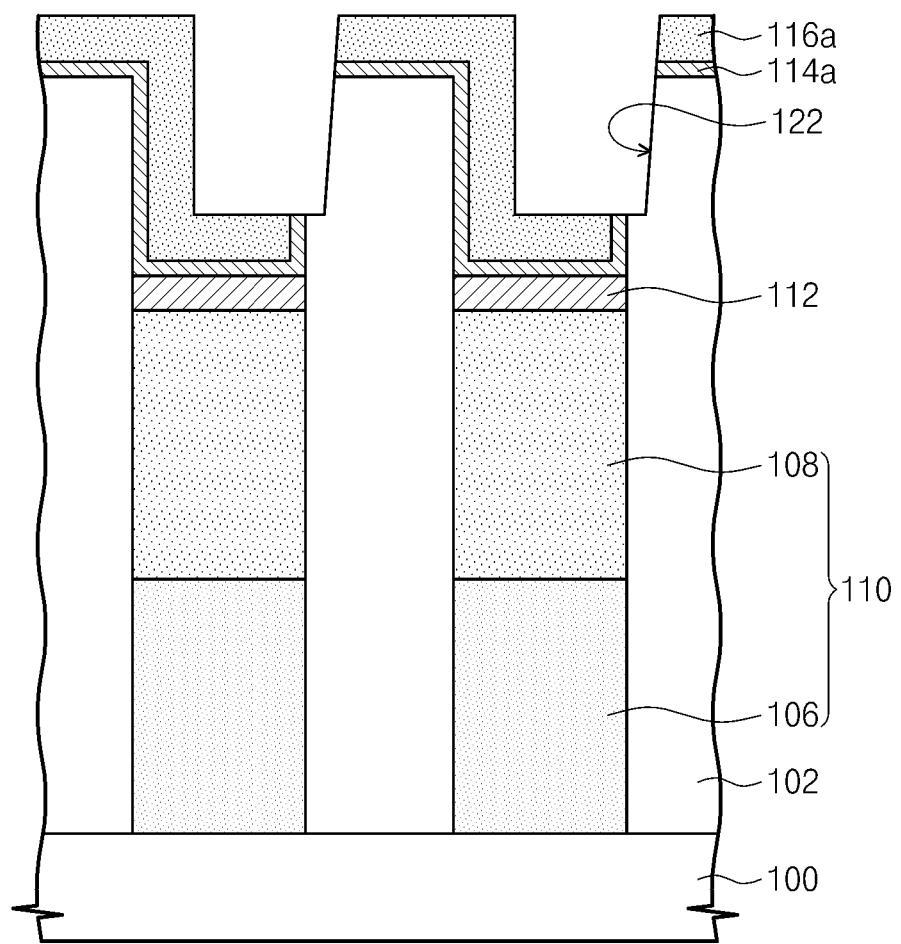

As illustrated in the sectional view of FIG. 11, in an exemplary embodiment in accordance with the principles of inventive concepts, after patterning and trench-forming as described in the discussion related to FIG. 10, photoresist pattern 120a and the organic anti-reflection pattern 118a may be removed, for example, using ashing and strip processes.

In accordance with the principles of inventive concepts, removal of photoresist pattern 120a and organic anti-reflection pattern 118a may increase the width of trench 122 and expose preliminary insulating pattern 116a and a portion of inter-insulating layer 102. An exposed portion of inter-insulating layer 102 may form a sidewall of trench 122. Additionally, portions of preliminary first insulating pattern 116a, preliminary first electrode, and inter-insulating layer 102 may be exposed to form the bottom surface of trench 122.

Figure 12:
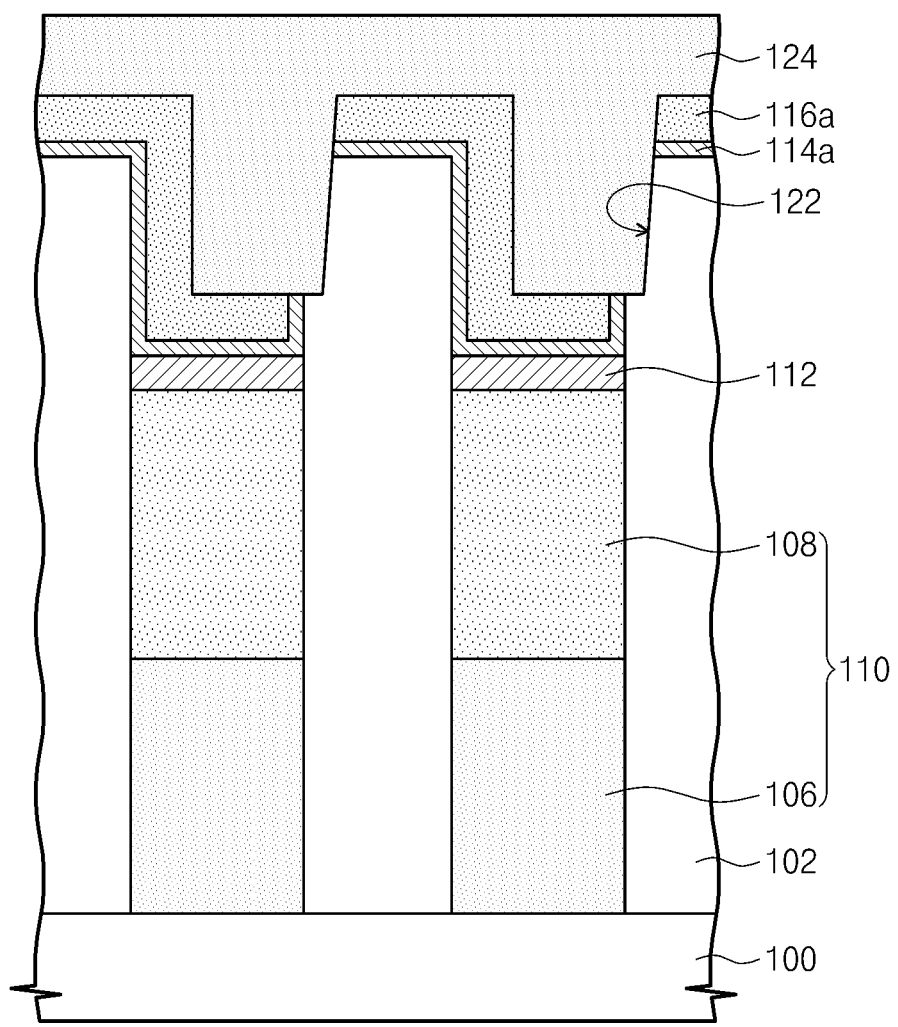

As illustrated in the sectional view of FIG. 12, a second insulating layer 124 may be formed on preliminary first insulating pattern 116a to fill trench 122 in accordance with principles of inventive concepts. Second insulating layer 124 may include the same material as preliminary first insulating pattern 116a. For example, second insulating layer 124 may include a nitride such as silicon nitride if first insulating layer 116 includes a nitride. According to another aspect of inventive concepts, second insulating layer 124 may include material different from that of preliminary first insulating pattern 116a: a silicon oxide or silicon oxynitride, if first insulating pattern 116a includes a nitride, for example.

Figure 13:
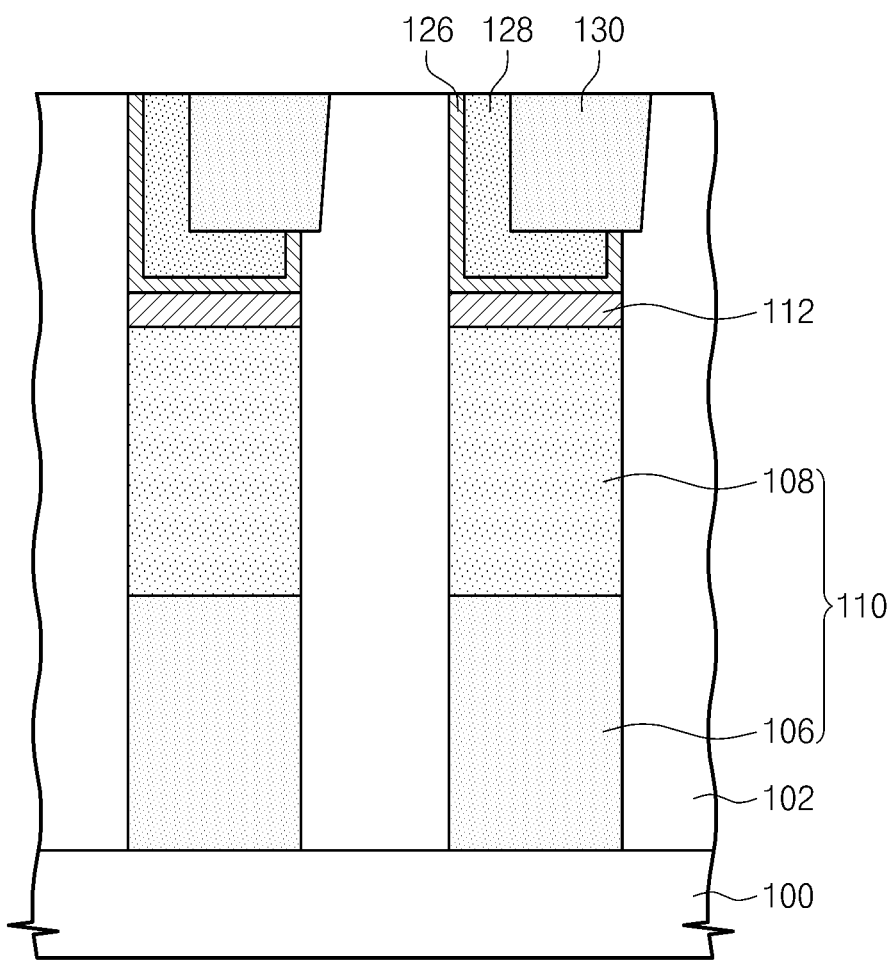

As illustrated in the sectional view of FIG. 13, in accordance with principles of inventive concepts, second insulating layer 124, preliminary first insulating pattern 116a and preliminary first electrode 114a may be etched until a top surface of the inter-insulating layer 102 is exposed to respectively form a second insulating pattern 130, a first insulating pattern 128 and a first electrode 126. More specifically, the second insulating layer 124, the preliminary first insulating pattern 116a and the preliminary first electrode 114a may be etched by an etch-back process or a chemical mechanical polishing process.

Figure 14:
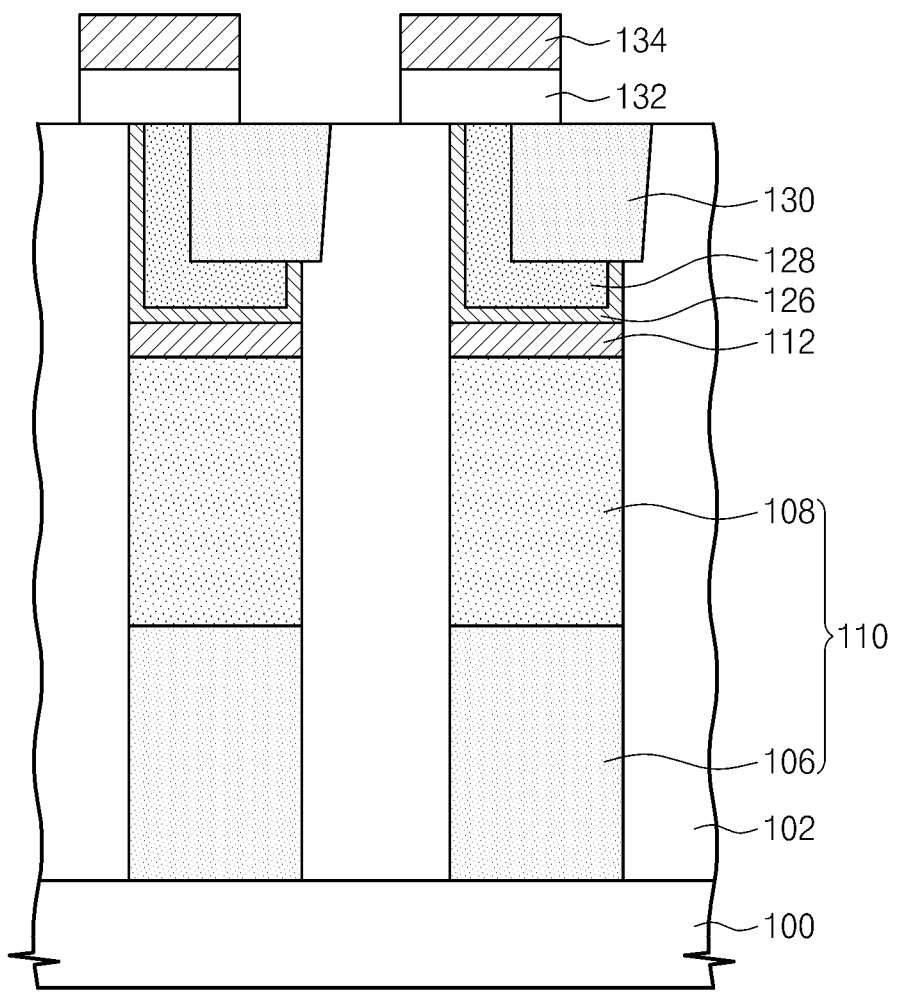

The sectional view of FIG. 14 illustrates the formation of a variable resistance pattern 132 and a second electrode 134 electrically connected to the first electrode 126 in accordance with principles of inventive concepts. Variable resistance pattern 132 may include chalcogenide material. The chalcogenide material may include at least one of D1-Ge—Sb—Te, D2-Ge—Bi—Te, D3-Sb—Te, D4-Sb—Se and D5-Sb. Where: D1 may include at least one of C, N, Si, Bi, In, As and Se; D2 may include at least one of C, N, Si, In, As and Se; D3 may include at least one of As, Sn, SnIn, 5B group element and 6B group element; D4 may include at least one of 5A group element and 6A group element; and D5 may include at least one of Ge, Ga and In.

In accordance with principles of inventive concepts, second electrode 134 may include titanium nitride (TiN), titanium aluminum nitride (TiAlN), tantalum nitride (TaN), molybdenum nitride (MoN), niobium nitride (NbN), titanium silicon nitride (TiSiN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium oxide nitride (TiON), titanium aluminum oxide nitride (TiAlON), tungsten oxide nitride (WON), tantalum oxide nitride (TaON), titanium, tungsten, molybdenum, tantalum, titanium silicide, tantalum silicide, graphite or combinations thereof.

Although not illustrated in detail, parallel spaced-apart bit lines running perpendicular to word lines may be formed to connect to electrically connect to second electrode 134 and to thereby dispose selection device 110 at the intersection of a bit line and a word line.

FIGS. 15 through 19 are cross sectional views and top plan views for describing a method of manufacturing a variable resistance memory device in accordance with another embodiment of the inventive concept. In this exemplary embodiment, word line, inter-insulating layer 102, hole 104, selection device 110, ohmic pattern 112, first electrode 114 and first insulating layer 116 may be formed on substrate 100 as previously described in the discussion related to FIGS. 4 though 8.

Figure 15:
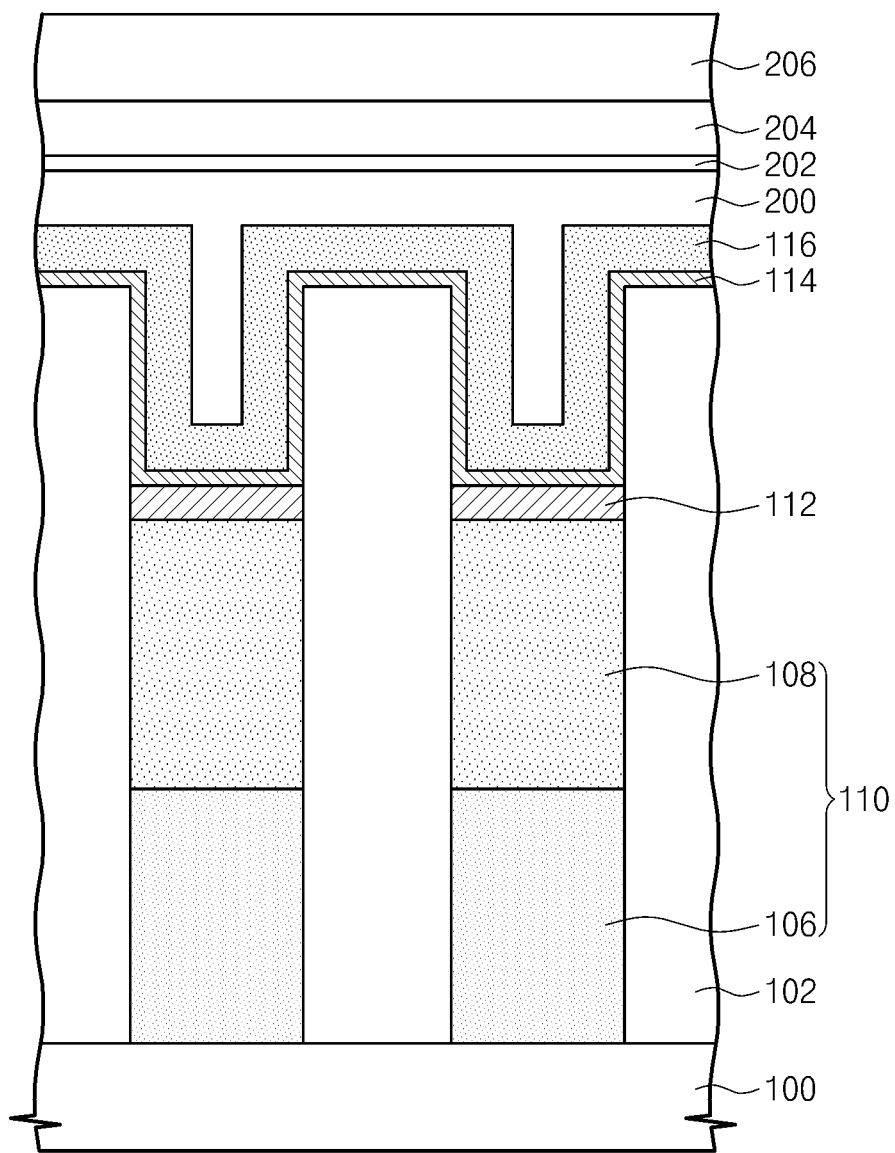
FIGS. 15 through 19 are cross sectional views and top plan views for describing a method of manufacturing variable resistance memory devices in accordance with principles of inventive concepts.

As illustrated in the sectional view of FIG. 15, in accordance with the principles of inventive concepts, an organic hard mask layer 200, an etch-stop layer 202, an organic anti-reflection layer 204 and a photoresist layer 206 may be sequentially formed, at least in part, to fill hole 104 in which first electrode layer 114 and first insulating layer 116 are formed.

In an exemplary embodiment a relatively low viscosity material, such as one including silicon organic hybrid (SOH), for example, may be used for organic hard mask layer 200 to ensure that hole 104 is filled without a seam or void. This is in contrast with higher viscosity materials, such as silicon nitride, which may form a seam or void in the process of filling hole 104 and thereby, eventually, expose lower electrode 114 and reduce the reliability of a PRAM device.

Figure 16:
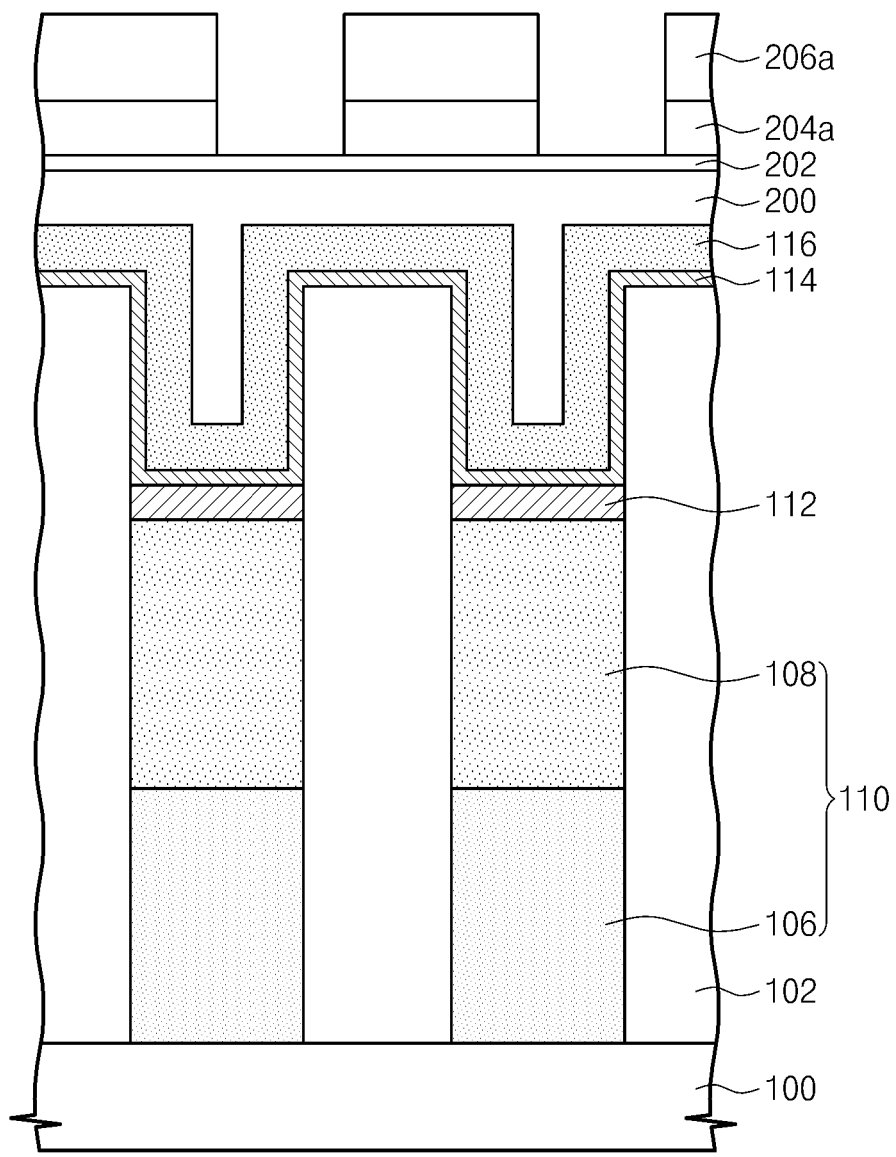

As illustrated in the sectional view of FIG. 16, in accordance with the principles of inventive concepts, photoresist pattern 206a and organic anti-reflection pattern 204a may be formed by performing an exposure process and a development process on photoresist layer 206. In an exemplary embodiment photoresist pattern 206a may mask at least a part of sidewall of hole 104 where first electrode layer 114 is formed.

Figure 17:
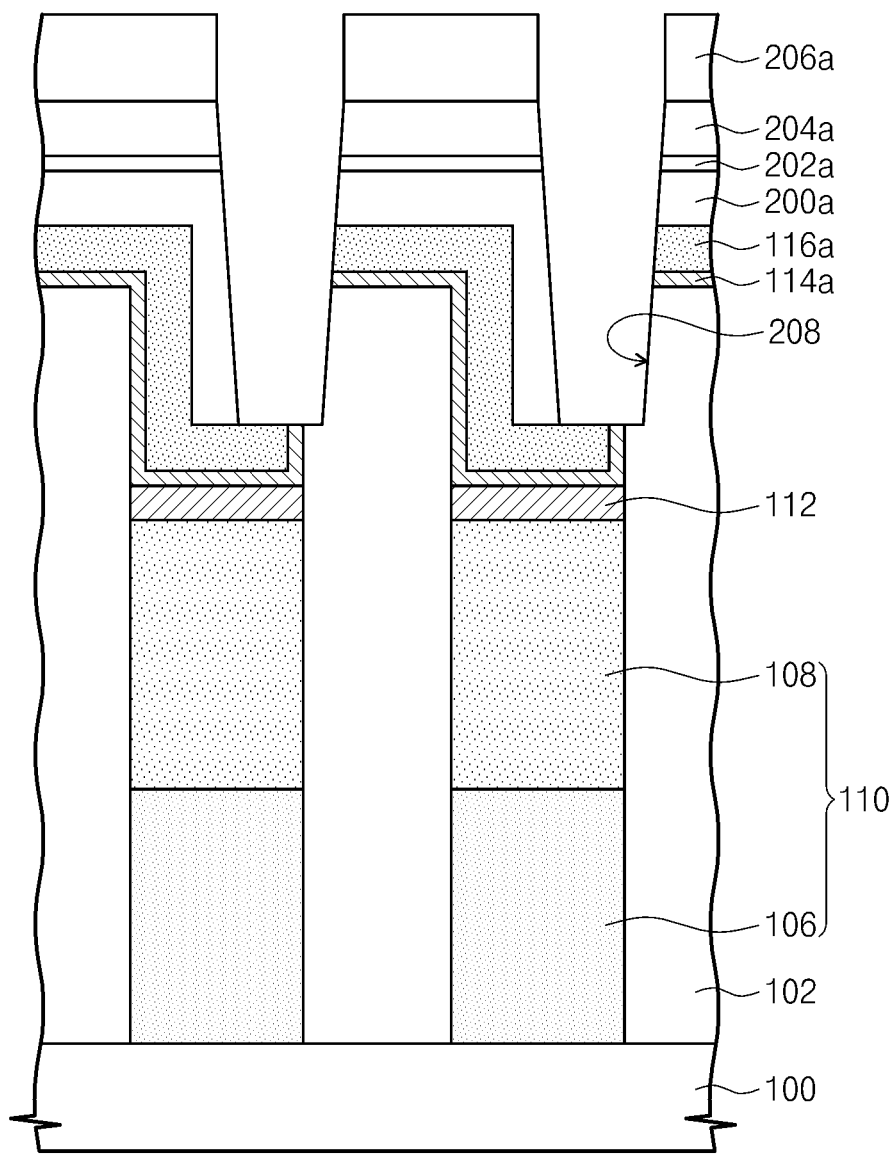

Referring to FIG. 17, in accordance with principles of inventive concepts, etch-stop layer 202 and the organic hard mask layer 200 may be etched using the photoresist pattern 206a as an etching mask to form an etch-stop pattern 202a and an organic hard mask 200a. First insulating layer 116 and first electrode layer 114 may be etched using organic hard mask 200a as an etching mask to form preliminary first insulating pattern 116a and a preliminary first electrode 114a. Organic hard mask 200a may expose at least a part of the first electrode layer 114 formed on a sidewall of the hole 104.

Figure 18:
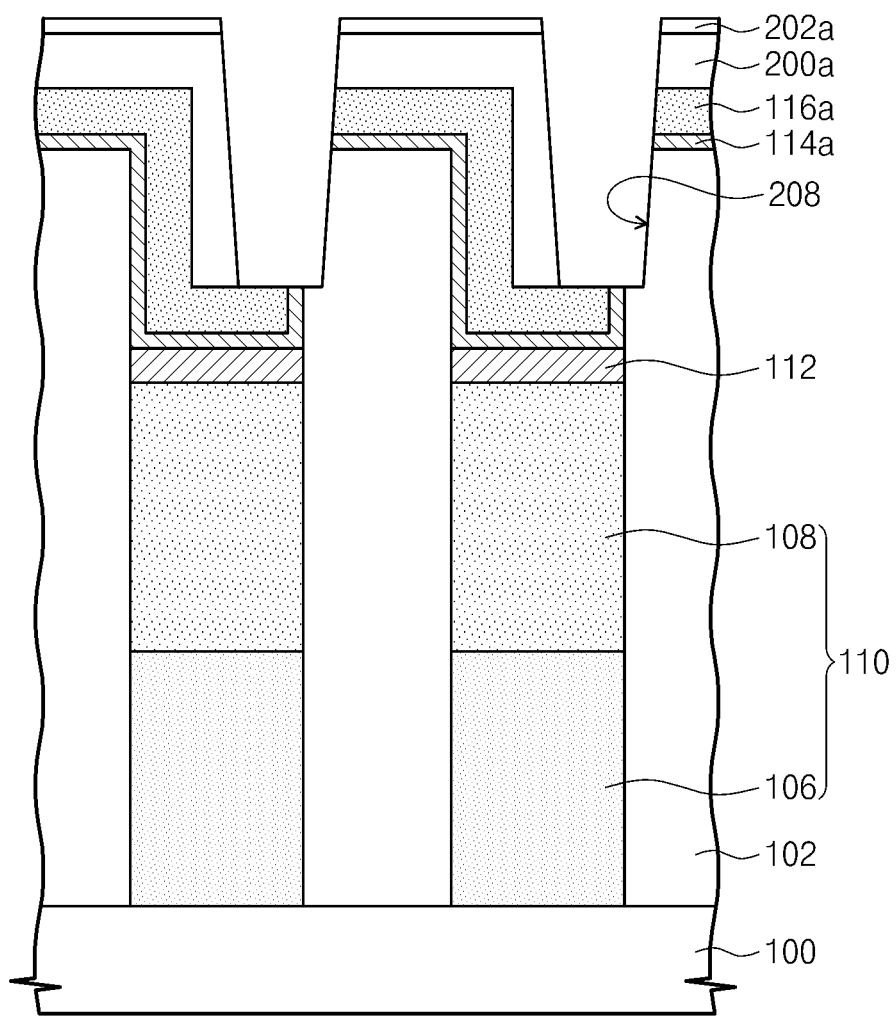

Referring to FIG. 18, after forming organic hard mask 200a, photoresist pattern 206a and organic anti-reflection pattern 204 may be removed, using an ashing process or strip process, for example. In an exemplary embodiment in accordance with inventive concepts, etch-stop pattern 202a may prevent organic hard mask 200a from being removed.

According to another exemplary embodiment in accordance with inventive concepts, without removing the photoresist pattern 206a and the organic anti-reflection pattern 204a, the photoresist pattern 206a, the organic anti-reflection pattern 204a and the etch-stop pattern 202a may be used as an etching mask together with the organic hard mask 204a in a subsequent etching process.

A bottom portion of first insulating layer 116 formed in hole 104 may not be etched and, as a result, preliminary first insulating pattern 116a remaining in hole 104 may have an "L" character shape, as described in the discussion related to FIGS. 3A and 3B, for example. In this exemplary embodiment, the etching process forms a trench 122 that intersects with hole 104 and extends downward to the top of first insulating pattern horizontal part 128a, leaving first electrode horizontal part 126a and first electrode vertical part 126b substantially intact and in contact, respectively, with the top of ohmic layer 112 and with a sidewall of hole 104. The etching process removes first electrode second vertical part 126c to a point where the top of first electrode second vertical part 126c is substantially level with the top of first insulating pattern horizontal part 128a. The intact portion of first electrode second vertical part 126c remains in contact with a sidewall of hole 104 and a trench 122 exposes a portion of inter-insulating layer 102 that is substantially flush with the top of electrode second vertical part 126c and the top of first insulating pattern horizontal part 128a. In this exemplary embodiment first electrode vertical part 128b may be longer than first electrode second vertical part 128c. Due to the nature of the etching process, trench 122 may narrow as it descends toward the top of first insulating pattern horizontal part 128a and may, as a result, have a sloping sidewall.

According to another exemplary embodiment in accordance with principles of inventive concepts, a bottom portion of first insulating layer 116 formed in hole 104 may be partly etched to expose a bottom portion of the first electrode layer 114, yielding a first electrode pattern having an "L" character shape. In such an exemplary embodiment, preliminary first insulating pattern 116a remaining in hole 104 may have an "L" character shape or an "I" character shape.

Organic hard mask 200a may be more resistant to etching than photoresist pattern 206a and may, therefore function as an etching mask in accordance with principles of inventive concepts.

Figure 19:
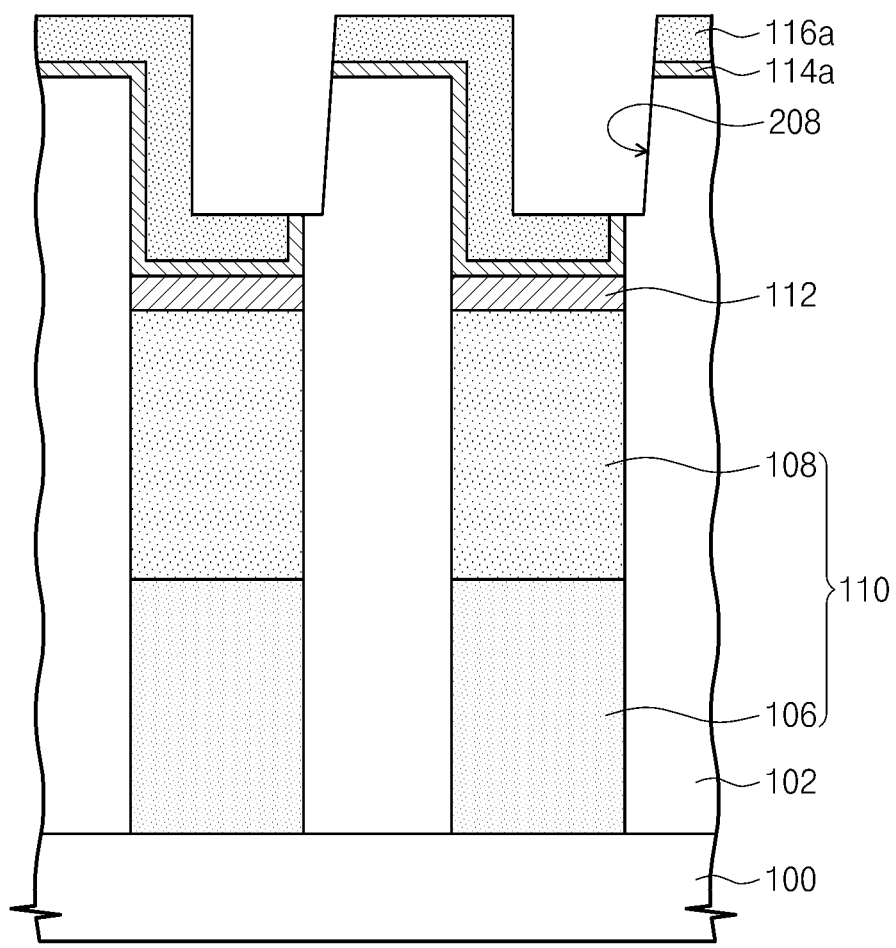

As illustrated in the sectional view of FIG. 19, in an exemplary embodiment in accordance with principles of inventive concepts, after patterning and trench formation, organic hard mask 200a may be removed.

In accordance with principles of inventive concepts, removal of organic hard mask 200a may increase the width of trench 122 and expose preliminary first insulating pattern 116a and a portion of inter-insulating layer 102. An exposed portion of inter-insulating pattern 102 may form a sidewall // of trench 122. Additionally, portions of preliminary first insulating pattern 116a, preliminary first electrode 114, and inter-insulating layer 102 may be exposed to form the bottom surface of trench 122.

In a subsequent process which may be the same process as that described in discussions related to FIGS. 12, 13 and 14, first insulating pattern 128, the first electrode 126 and the second insulating pattern 130 may be formed and the variable resistance pattern 132 electrically connected to the first electrode 126 and the second electrode 134 may be formed.

Figure 20:
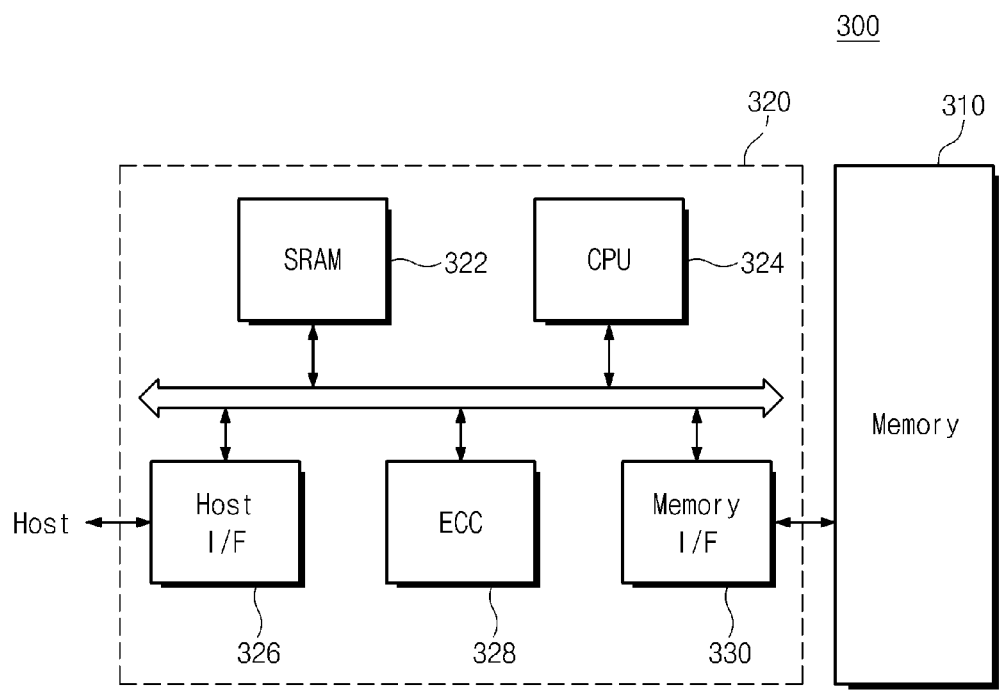
FIG. 20 is a block diagram illustrating a memory card including a variable resistance memory device in accordance with principles of inventive concepts.

The block diagram of FIG. 20 illustrates components of a memory card 300 (also referred to herein as memory system, or, simply, memory) in accordance with principles of inventive concepts that employs a variable resistance memory device in accordance with principles of inventive concepts.

In an exemplary embodiment, memory card 300 may include a memory controller 320 that controls data exchange between a host and a variable resistance memory device 310. A SRAM 322 may be used as an operation memory of a central processing unit (CPU) 324. A host interface 326 may include data exchange protocols of the host accessing the memory card 300. An error correction code 328 may detect and correct an error included in data output from the variable resistance memory device 30. A memory interface 330 interfaces with the variable resistance memory device 310. In this exemplary embodiment, central processing unit (CPU) 324 controls data exchange for memory controller 320.

A variable resistance memory device 310 in accordance with principles of inventive concepts may avoid the creation of a seam or void in an insulating layer and, thereby, ensure more reliable operation of a memory card 300 that employs such a device.

Figure 21:
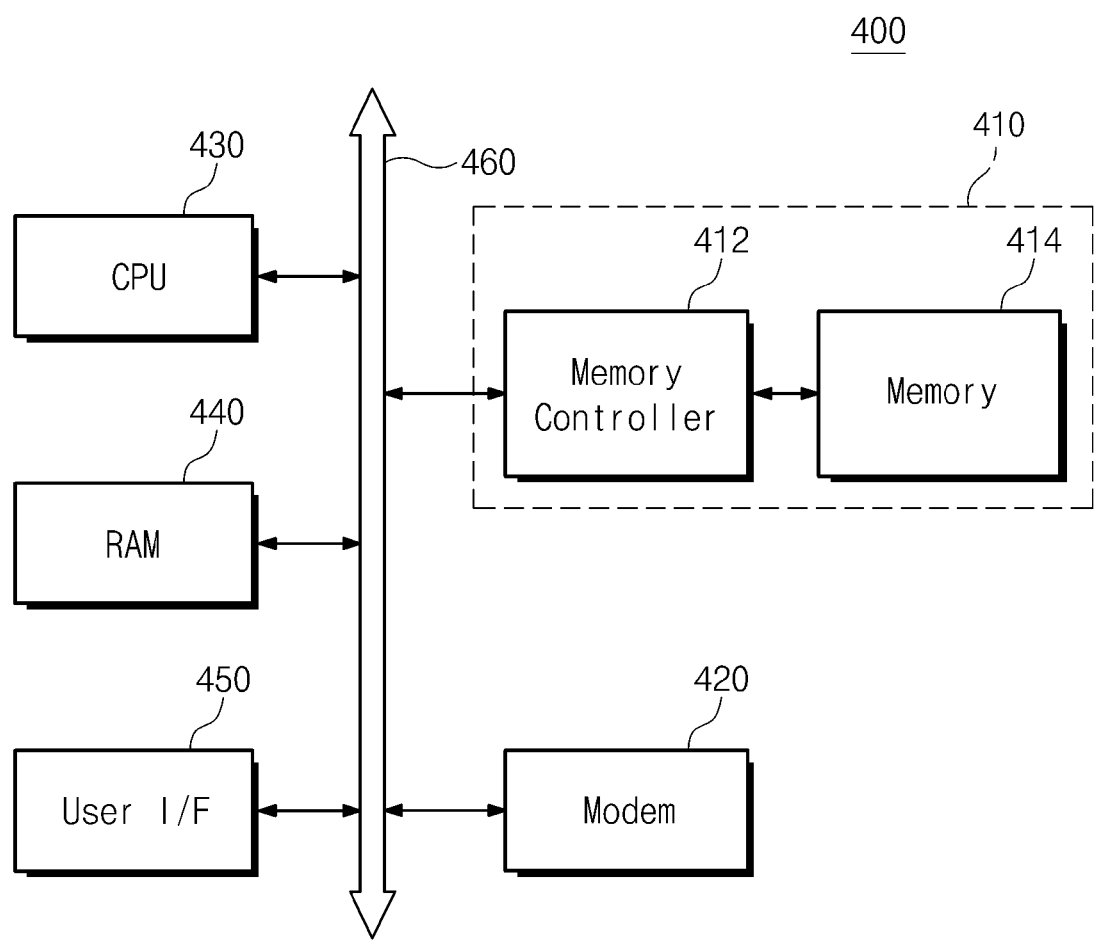
FIG. 21 is a block diagram illustrating an information processing system which employs a memory device in accordance with principles of inventive concepts.

The block diagram of FIG. 21 illustrates components of an information processing system that employs a variable resistance memory device in accordance with principles of inventive concepts.

In the exemplary embodiment of FIG. 21 information processing system 400 may include memory system 410 that employs a variable resistance memory in accordance with principles of inventive concepts. Information processing system 400 may include a mobile device or a computer, for example. In an exemplary embodiment, information processing system 400 may include memory system 410, and modem 420, central processing unit 430, RAM 440 and a user interface 450 that are electrically connected to system bus 460. Memory system 410 may store data processed by the central processing unit 430 or data input from an external device, for example. Memory system 410 may include memory controller 412 and memory 414 and may be implemented as memory card 300 described with reference to FIG. 20. Information system 400 may be implemented as a solid state disk (SSD), a camera image sensor, or an application chipset, for example.

According to exemplary embodiments of inventive concepts, insulating patterns in which generation of a void or a seam is suppressed may be formed using a photoresist layer or an organic polymer compound layer. Avoiding the creation of a seam or void increases the reliability of variable resistance memory in accordance with principles of inventive concepts. Additionally, the number of steps of an etching process may be reduced by using a photoresist pattern as an etching mask.

Although a exemplary embodiments in accordance with inventive concepts have been shown and described, it will be appreciated by those skilled in the art that changes may be made in these embodiments without departing from the principles and spirit of inventive concepts, the scope of which is defined in the appended claims and their equivalents. The above-disclosed subject matter is to be considered illustrative, and not restrictive.

What is claimed is:

1. A method of manufacturing a variable resistance memory device comprising:
    forming an inter-insulating layer including a hole on a substrate;
    forming a selection device in a lower portion of the hole;
    forming a first electrode including a first part electrically connected to the selection device and contacting a side surface of upper portion of the hole and a second part extending from the first part to be parallel to a surface of the substrate;
    forming a first insulating pattern including a third part contacting the first part and a fourth part extending from the third part to contact the second part and having the same thickness as the third part, the first insulating pattern being disposed on the first electrode;
    forming a trench limited by the first insulating pattern and the inter-insulating layer by partly etching a sidewall of the inter-insulating layer facing the third part;
    forming a second insulating pattern filling the trench; and
    forming a variable resistance pattern and an upper electrode on the first electrode.

2. The method of claim 1, wherein forming the first electrode comprises:
    conformally forming a first electrode layer on the inter-insulating layer including the hole in which the selection device is formed;
    conformally forming a first insulating layer on the first electrode layer;
    forming a photoresist pattern partly covering the first insulating layer formed on a sidewall of the hole, the photoresist pattern being disposed on the first insulating layer; and
    etching the first electrode layer and the first insulating layer using the photoresist pattern as an etching mask to form the first insulating pattern concurrently with the first electrode.

3. The method of claim 2, wherein forming the photoresist pattern comprises:
    forming an organic anti-reflection layer and a photoresist layer filling the hole in which the first insulating layer is formed; and
    forming the photoresist pattern and an organic anti-reflection pattern by performing an exposure process and a development process on the photoresist layer.

4. The method of claim 2, wherein the trench is formed by removing the photoresist pattern.

5. The method of claim 1, wherein forming the first electrode comprises:

conformally forming a first electrode layer on the inter-insulating layer including the hole in which the selection device is formed;
conformally forming a first insulating layer on the first electrode layer;
forming an organic hard mask partly covering the first insulating layer formed on a sidewall of the hole; and
etching the first electrode layer and the first insulating layer using the organic hard mask as an etching mask to form the first insulating pattern in concurrence with the first electrode.

6. The method of claim 5, wherein forming the organic hard mask comprises:
forming an organic polymer compound filling the hole in which the first insulating layer is formed; and
forming the organic hard mask by patterning the organic polymer compound.

7. The method of claim 5, wherein the organic polymer compound comprises silicon organic hybrid.

8. The method of claim 5, wherein the trench is formed by removing the organic hard mask.

9. The method of claim 1, wherein the first insulating pattern comprises material having an etching selectivity with respect to the inter-insulating layer.

10. The method of claim 1, further comprising forming an ohmic pattern between the selection device and the first electrode.

11. A method of forming a variable-resistance integrated circuit memory in a wafer, comprising:
forming a hole within an inter-insulating layer formed on a substrate;
forming a selection device in a lower portion of the hole;
forming an electrode layer in the hole over the selection device;
forming an insulating layer over the electrode layer in the hole;
burying the hole with a relatively low-viscosity material;
forming a trench in the low-viscosity material and in a portion of the electrode layer and in a portion of the insulating layer and in a portion of the inter-insulating layer, leaving at least a vertical segment of electrode layer and a vertical segment of insulating layer in the hole;
removing the low-viscosity material and filling the remnant of the trench with a second insulating layer;
planarizing the wafer to expose a first electrode pattern, a first insulating pattern, and a second insulating pattern, the tops of which are all substantially at the same height as the top of the inter-insulating layer;
forming a variable resistance pattern on top of and in contact with the top of the first electrode pattern; and
forming a second electrode pattern on top of the variable resistance pattern.

12. The method of claim 11, wherein the step of forming a hole within an inter-insulating layer further comprises forming a hole over a first memory access line.

13. The method of claim 12, wherein the step of forming a second electrode pattern further comprises forming a second memory access line in contact with the second electrode.

14. The method of claim 11, wherein the step of forming a selection device further comprises the step of forming a diode.

15. The method of claim 11, wherein the step of forming a variable resistance pattern further comprises forming a pattern of phase change material.

* * * * *